(12) United States Patent
Kawai

(10) Patent No.: US 8,390,389 B2
(45) Date of Patent: Mar. 5, 2013

(54) VIBRATOR ELEMENT, VIBRATOR, VIBRATION DEVICE, ELECTRONIC APPARATUS, AND FREQUENCY ADJUSTMENT METHOD

(75) Inventor: Hiroki Kawai, Chino (JP)

(73) Assignee: Seiko Epson Corporation (JP)

( * ) Notice: Subject to any disclaimer, the term of this patent is extended or adjusted under 35 U.S.C. 154(b) by 6 days.

(21) Appl. No.: 13/118,810

(22) Filed: May 31, 2011

(65) Prior Publication Data

US 2011/0298555 A1 Dec. 8, 2011

(30) Foreign Application Priority Data

Jun. 8, 2010 (JP) ................................. 2010-130731

(51) Int. Cl.
*H03H 9/21* (2006.01)
*H03B 5/32* (2006.01)

(52) U.S. Cl. ......... 331/156; 333/200; 310/370; 331/158

(58) Field of Classification Search ................. 331/156, 331/158; 310/370; 333/200
See application file for complete search history.

(56) References Cited

U.S. PATENT DOCUMENTS

| | | | |
|---|---|---|---|
| 7,764,145 B2 | 7/2010 | Iwai | |
| 8,164,393 B2 * | 4/2012 | Yamada | ........................ 331/156 |
| 8,203,256 B2 * | 6/2012 | Saito | ............................. 310/370 |

FOREIGN PATENT DOCUMENTS

| | | |
|---|---|---|
| JP | 2008-160824 | 7/2008 |
| JP | 2009-005022 | 1/2009 |
| JP | 2009-124310 | 6/2009 |

* cited by examiner

*Primary Examiner* — Joseph Chang
(74) *Attorney, Agent, or Firm* — Harness, Dickey & Pierce, P.L.C.

(57) ABSTRACT

A vibrator element includes: a base section formed on a plane including a first direction and a second direction perpendicular to the first direction; and a vibrating arm extending from the base section in the first direction, wherein the vibrating arm flexurally vibrates in a normal direction of the plane, and has a first surface one of compressed and extended due to the flexural vibration and a second surface one of extended when the first surface is compressed and compressed when the first surface is extended, the first surface is provided with a first mass section, and the second surface is provided with a second mass section, and at least one of the first mass section and the second mass section has a portion, which fails to be opposed to the other of the first mass section and the second mass section in a plan view in the normal direction.

15 Claims, 14 Drawing Sheets

VIBRATOR ELEMENT, VIBRATOR, VIBRATION DEVICE, ELECTRONIC APPARATUS, AND FREQUENCY ADJUSTMENT METHOD

BACKGROUND

1. Technical Field

The present invention relates to a vibrator element, a vibrator, a vibration device, an electronic apparatus, and a frequency adjustment method.

2. Related Art

As the vibration device such as a quartz crystal oscillator, there is known a device provided with a tuning-fork vibrator element having a plurality of vibrating arms (see, e.g., JP-A-2009-5022 (Document 1)).

For example, the vibrator element described in Document 1 has a base section, three vibrating arms extending from the base section in parallel to each other, and a piezoelectric element composed of a lower electrode film, a piezoelectric film, and an upper electrode film formed on each of the vibrating arms in this order. In such a vibrator element, each of the piezoelectric elements is provided with an electrical field applied between the lower electrode film and the upper electrode film, thereby making the piezoelectric layer compress, and causing the flexural vibration in the vibrating arms in a direction (so-called an out-of-plane direction) of the thickness of the base section.

In such a vibrator element, in general, a metal film is provided on the tip portion of each of the vibrating arms, and the metal film is partially removed by laser irradiation, thereby performing the adjustment of the frequency (the resonant frequency) of the flexural vibration of the vibrating arms (see, e.g., JP-A-2008-160824 (Document 2)).

For example, according to the frequency adjustment method described in Document 2, metal films for adjusting the frequency are formed on respective plate surfaces of the vibrating arms each having a plate-like shape so as to have the same patterns. Then, by irradiation with the laser beam, a part of the metal film on one of the plate surfaces of the vibrating arm and a part of the metal film on the other of the plate surfaces are removed simultaneously to thereby perform coarse adjustment, and then, by irradiation with the argon ion beam, a part of the one of the plate surfaces of the vibrating arm is further removed to thereby perform fine adjustment.

However, according to the frequency adjustment method described in Document 2, since the metal film on the one of the plate surfaces of the vibrating arm and the metal film on the other of the plate surfaces have the same patterns, the metal film on the one of the plate surfaces of the vibrating arm and the other of the plate surfaces are removed simultaneously by irradiation with the laser beam. Therefore, there arises a problem that it is difficult to separately remove a part of the metal film on the one of the plate surfaces of the vibrating arm and a part of the metal film on the other of the plate surfaces by irradiation with the laser beam, and therefore, the fine adjustment of the frequency is difficult.

Incidentally, the frequency "f" of the flexural vibrator is given as $f \approx t/L^2$ ("t" denotes the thickness of the vibrating arm in the vibration direction, "L" denotes the length of the vibrating arm in the extending direction), and in the case of achieving downsizing of the vibrator having the vibrating arm perform flexural vibration in the out-of-plane direction as described in Document 1 mentioned above, if the length L of the vibrating arm is reduced, it is required to reduce the thickness "t" of the vibrating arm in the vibration direction (the thickness direction of the vibrating arm) of the vibrating arm in accordance with the reduction in the length L. Specifically, since the thickness of the vibrating arm in the vibration direction is as considerably small as several micrometers, it is easy for the laser beam emitted from one side of the vibrating arm to reach the other side of the vibrating arm. Further, since the smaller the thickness of the vibrating arm is, the larger the variation (the amount of rise) in the frequency with respect to the mass (the mass to be reduced) of the metal film to be removed becomes, the fine adjustment of the frequency becomes difficult. In contrast, in the typical vibrator element having the vibrating arm perform the flexural vibration in a plane having the normal line in the thickness direction of the base section, the thickness "t" of the vibrating arm in the vibration direction corresponds to the width direction of the vibrating arm. Therefore, since there is no need for forming the vibrating arm as a thinner plate, the problem described above does not arise. According to such circumstances as described above, if such a frequency adjustment method as described above is used in the vibrator element having the vibrating arm perform the flexural vibration in the out-of-plane direction, the problem that the metal films on the both surfaces are removed by the laser penetrating the vibrating arm when adjusting the frequency, thereby shifting the frequency from the target frequency becomes prominent.

SUMMARY

An advantage of the invention is to provide a vibrator element frequency adjustment of which can easily be performed, a frequency adjustment method which can easily be performed, and a vibrator, a vibration device, and an electronic apparatus which are provided with the vibrator element, and are therefore superior in reliability.

APPLICATION EXAMPLE 1

According to this application example of the invention, there is provided a vibrator element including a base section formed on a plane including a first direction and a second direction perpendicular to the first direction, and a vibrating arm extending from the base section in the first direction, wherein the vibrating arm flexurally vibrates in a normal direction of the plane, and has a first surface one of compressed and extended due to the flexural vibration and a second surface one of extended when the first surface is compressed and compressed when the first surface is extended, the first surface is provided with a first mass section, and the second surface is provided with a second mass section, and at least one of the first mass section and the second mass section has a portion, which fails to be opposed to the other of the first mass section and the second mass section in a plan view in the normal direction.

Thus, it is possible to remove at least one of the first mass section and the second mass section (selectively) in accordance with, for example, the irradiation position with an energy beam. Therefore, the elimination quantities of the first mass section and the second mass section due to the irradiation with the energy beam can be adjusted with high accuracy. Therefore, the adjustment of the frequency (the resonant frequency) can be performed with ease and high accuracy.

APPLICATION EXAMPLE 2

According to this application example of the invention, in the vibrator element of the above application example of the invention, it is preferable that the first mass section and the second mass section have respective portions formed adjacent to each other in the second direction in a plan view in the normal direction.

Thus, it is possible to make the range of the first mass section in the first direction (the longitudinal direction of the vibrating arm) and the range of the second mass section in the first direction be match or overlap each other. Therefore, it is possible to reduce the length the first mass section and the second mass section occupy in the vibrating arm in the longitudinal direction (the first direction).

APPLICATION EXAMPLE 3

According to this application example of the invention, in the vibrator element of the above application example of the invention, it is preferable that at least one of the first mass section and the second mass section is formed to have a strip shape.

Thus, it becomes possible to irradiate the first mass section or the second mass section with the energy beam continuously in a line, and thus, the first mass section or the second mass section can be removed in a lump. Therefore, the first mass section or the second mass section can promptly be removed as much as the desired amount. As a result, the frequency adjustment becomes easier and more accurate.

APPLICATION EXAMPLE 4

According to this application example of the invention, in the vibrator element of the above application example of the invention, it is preferable that at least one of the first mass section and the second mass section has a plurality of block sections disposed with intervals.

Thus, it becomes easy to predict the variation in the frequency of the vibrating arm with respect to the elimination quantity of the block sections provided to the first mass section or the second mass section. As a result, the frequency adjustment becomes easier and more accurate.

APPLICATION EXAMPLE 5

According to this application example of the invention, in the vibrator element of the above application example of the invention, it is preferable that the first mass section and the second mass section are each formed to have a strip shape, and have respective portions intersecting with each other in a plan view in the normal direction.

Thus, when forming the first mass section and the second mass section on the vibrating arm, the first mass section and the second mass section each have portions, which do not overlap each other when viewed in the normal direction of the plane including the first direction and the second direction, without requiring high accuracy in the positioning in the first direction and the second direction.

APPLICATION EXAMPLE 6

According to this application example of the invention, in the vibrator element of the above application example of the invention, it is preferable that the second mass section is made of a material having specific gravity smaller than a constituent material of the first mass section.

Thus, it is possible to make the variation in the frequency (the resonant frequency) of the vibrating arm with respect to the elimination quantity of the first mass section larger than the variation in the frequency (the resonant frequency) of the vibrating arm with respect to the elimination quantity of the second mass section. Therefore, by using the first mass section for the coarse adjustment, and the second mass section for the fine adjustment, the frequency adjustment can be easier and highly accurate.

APPLICATION EXAMPLE 7

According to this application example of the invention, in the vibrator element of the above application example of the invention, it is preferable that at least one of the first mass section and the second mass section is constituted using at least one of $SiO_2$, Al, $Al_2O_3$, $TiO_2$, Cr, Fe, Ni, Cu, Ag, Au, and Pt.

The metal or the insulating material (e.g., ceramics) can be deposited by a vapor-phase deposition method with ease and high accuracy. Further, the film (the weight film) made of metal or the insulating material can be removed by irradiation with the energy beam (particularly a laser beam) with ease and high accuracy. Therefore, by forming each of the first mass section and the second mass section by depositing metal or the insulating material, the frequency adjustment becomes easier and highly accurate.

APPLICATION EXAMPLE 8

According to this application example of the invention, in the vibrator element of the above application example of the invention, it is preferable that a thickness of the first mass section is larger than a thickness of the second mass section.

Thus, it is possible to make the variation in the frequency (the resonant frequency) of the vibrating arm with respect to the elimination quantity of the first mass section larger than the variation in the frequency (the resonant frequency) of the vibrating arm with respect to the elimination quantity of the second mass section. Therefore, by using the first mass section for the coarse adjustment, and the second mass section for the fine adjustment, the frequency adjustment can be easier and highly accurate.

APPLICATION EXAMPLE 9

According to this application example of the invention, in the vibrator element of the above application example of the invention, it is preferable that the first mass section and the second mass section are disposed in a vicinity of a tip portion of the vibrating arm.

Thus, it is possible to increase the variation in the frequency (the resonant frequency) of the vibrating arm with respect to the elimination quantity of the first mass section and the second mass section. Therefore, the frequency adjustment can efficiently be performed. Further, it is possible to form the excitation electrodes and the piezoelectric elements on the vibrating arm from the base portion to the area around the center, and to efficiently use the space remaining in the vicinity of the tip portion of the vibrating arm for disposing the first mass section and the second mass section. Therefore, reduction in length of the vibrating arm, and therefore, downsizing of the vibrator element can be achieved.

APPLICATION EXAMPLE 10

According to this application example of the invention, in the vibrator element of the above application example of the invention, it is preferable that the vibrating arm is provided with a piezoelectric layer disposed between a first electrode layer and a second electrode layer.

Thus, the vibrating arm can be made to perform the flexural vibration in the predetermined direction with efficiency even in the case in which the vibrating arm itself has no piezoelectric property, or in the case in which the directions of the polarization axis and the crystal axis are not suitable for the flexural vibration in the predetermined direction although the vibrating arm has the piezoelectric property. Further, since whether or not the vibrating arm has the piezoelectric property and the directions of the polarization axis and the crystal axis are made irrelevant, the range of choice of the material of the vibrating arm is broadened, and as a result, the dimensional accuracy of the vibrating arm can easily be made highly accurate. As a result, the vibration characteristics of the vibrating arm can be made preferable.

APPLICATION EXAMPLE 11

According to this application example of the invention, in the vibrator element of the above application example of the invention, it is preferable that two or more of the vibrating arms are disposed side by side in the second direction, and the two vibrating arms adjacent to each other flexurally vibrate in respective directions reverse to each other.

Thus, it is possible to cancel out the leakage vibrations of the two vibrating arms adjacent to each other. As a result, the vibrator element with small vibration leakage can be realized.

APPLICATION EXAMPLE 12

According to this application example of the invention, there is provided a frequency adjustment method including: providing a vibrator element having a vibrating arm, which flexurally vibrates in a normal direction of a plane including a first direction and a second direction perpendicular to the first direction, and has a first surface one of compressed and extended due to the flexural vibration and a second surface one of extended when the first surface is compressed and compressed when the first surface is extended, the first surface being provided with a first mass section, the second surface being provided with a second mass section, and at least one of the first mass section and the second mass section having a portion, which fails to be opposed to the other of the first mass section and the second mass section in a plan view in the normal direction; and varying a mass of at least one of the first mass section and the second mass section, thereby adjusting a resonant frequency of the vibrating arm.

Thus, it is possible to remove the first mass section and the second mass section separately (selectively) in accordance with, for example, the irradiation position with the energy beam. Therefore, the adjustment of the frequency (the resonant frequency) can be performed with ease and high accuracy.

APPLICATION EXAMPLE 13

According to this application example of the invention, there is provided a vibrator including the vibrator element of any of the above application examples of the invention, and a package adapted to house the vibrator element.

Thus, the vibrator superior in reliability can be provided.

APPLICATION EXAMPLE 14

According to this application example of the invention, there is provided a vibration device including the vibrator element of any of the above application examples of the invention, and an oscillator circuit connected to the vibrator element.

Thus, the vibration device such as an oscillator superior in reliability can be provided.

APPLICATION EXAMPLE 15

According to this application example of the invention, there is provided an electronic apparatus including the vibrator element of any of the above application examples of the invention.

Thus, the electronic apparatus such a cellular phone, a personal computer, or a digital camera superior in reliability can be provided.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, a vibrator element, a frequency adjustment method, a vibrator, a vibration device, and an electronic apparatus according to the invention will be explained in detail based on the embodiments shown in the accompanying drawings.

First Embodiment

Figure 1:
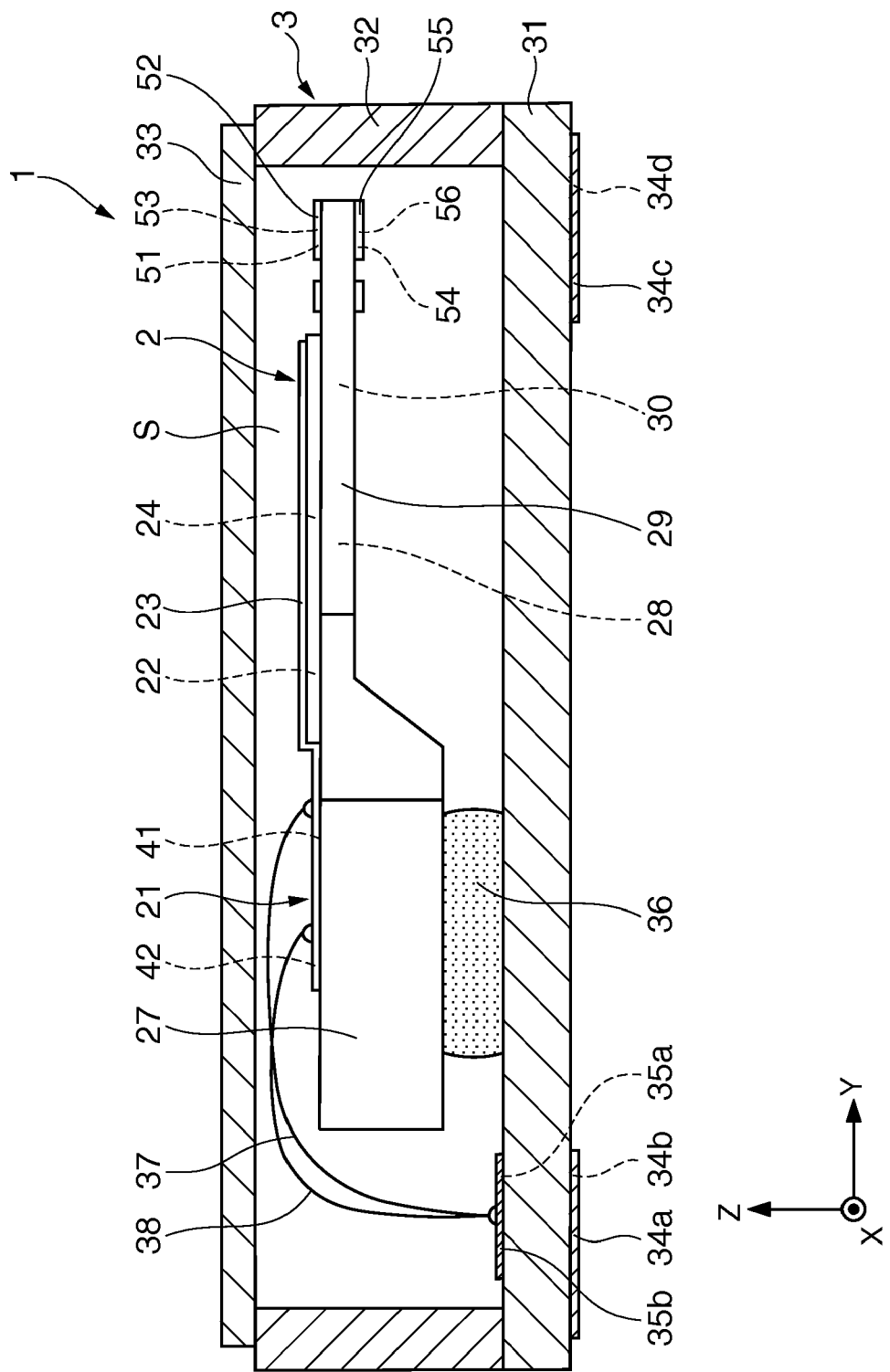
FIG. 1 is a cross-sectional view showing a vibrator according to a first embodiment of the invention.
Figure 2:
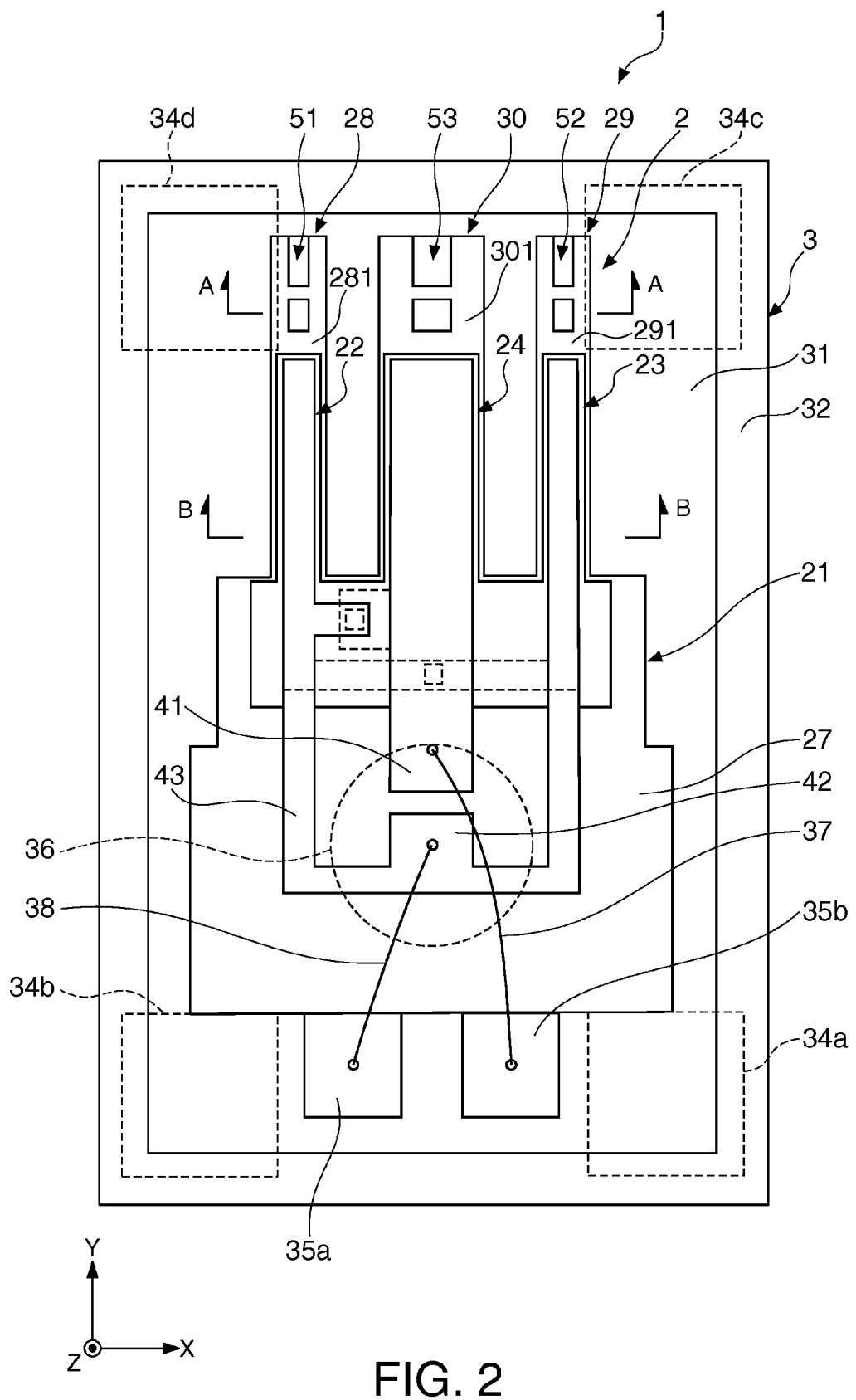
FIG. 2 is a top view showing the vibrator shown in FIG. 1.
Figure 3:
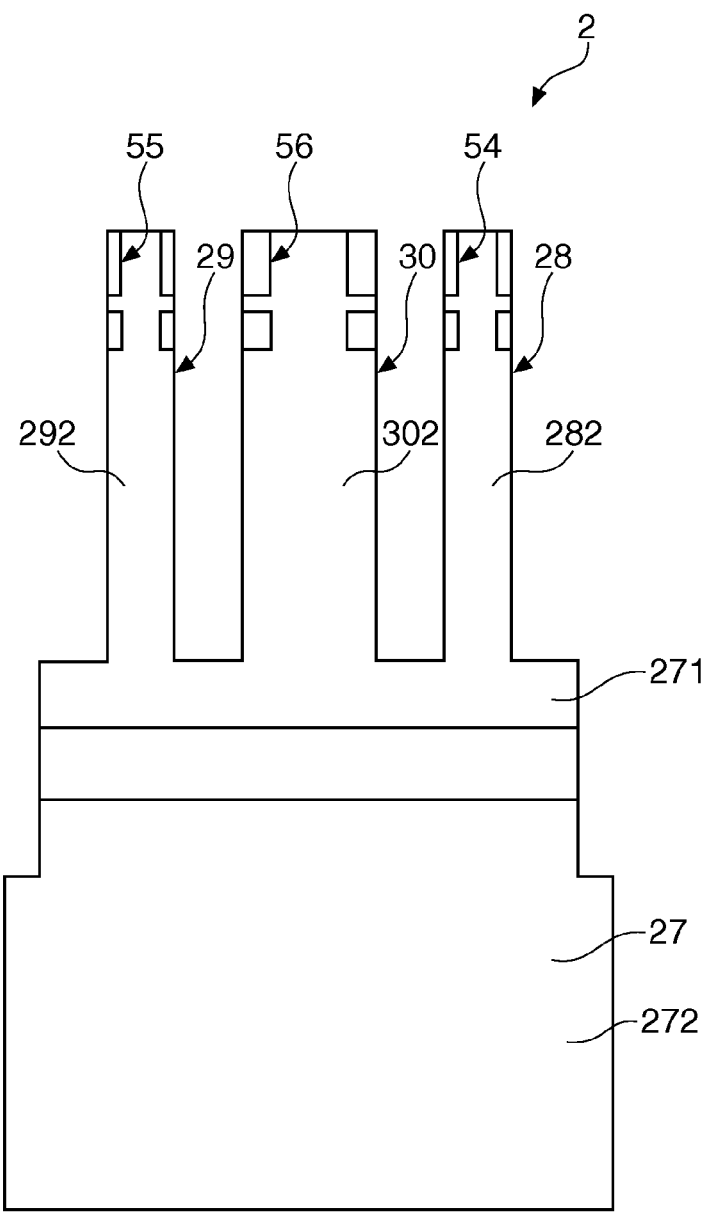
FIG. 3 is a bottom view showing a vibrator element provided to the vibrator shown in FIG. 1.
Figure 4A:
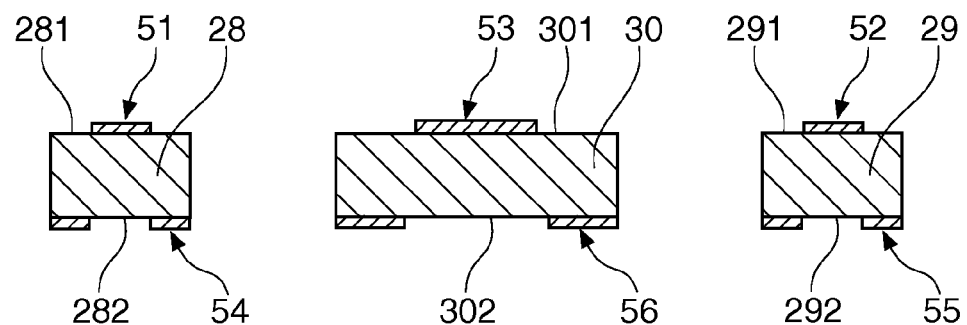
FIG. 4A is a cross-sectional view along the line A-A in FIG. 2.
Figure 4A:
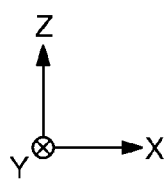
Figure 4B:
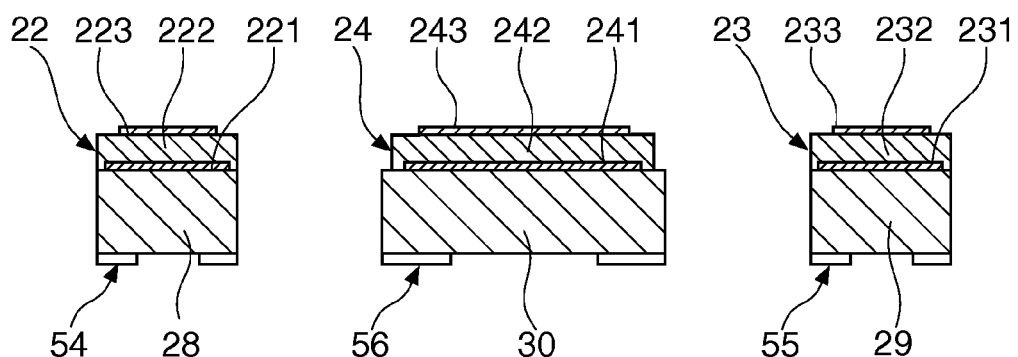
FIG. 4B is a cross-sectional view along the line B-B in FIG. 2.
Figure 4B:
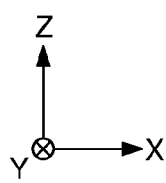
Figure 5A:
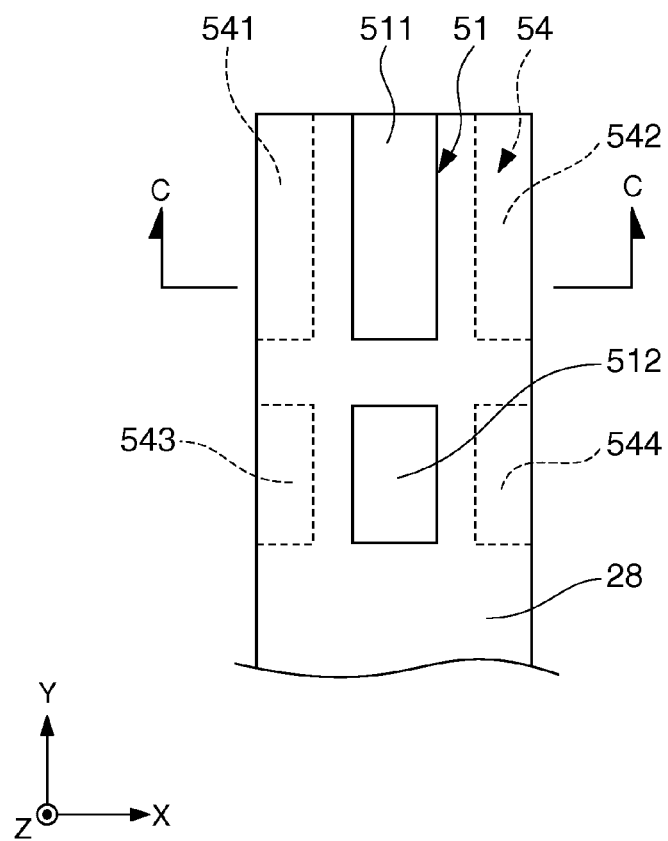
FIGS. 5A and 5B are partial enlarged views (FIG. 5A is a top view, and FIG. 5B is a cross-sectional view along the line C-C in FIG. 5A) for explaining a first mass section and a second mass section shown in FIG. 4A.
Figure 5B:
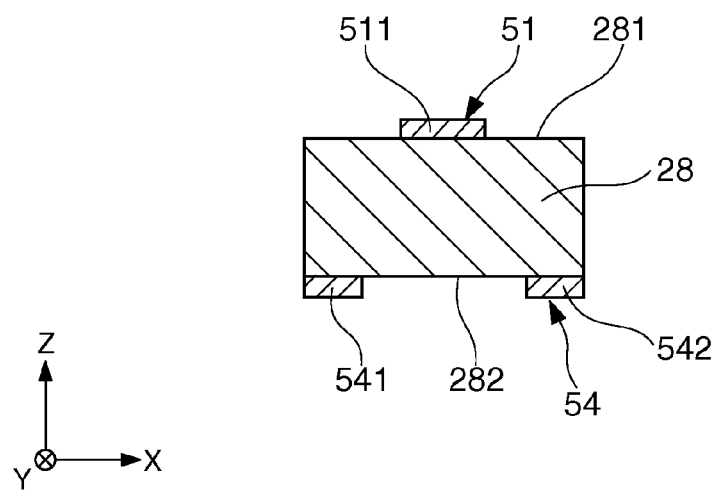
Figure 6:
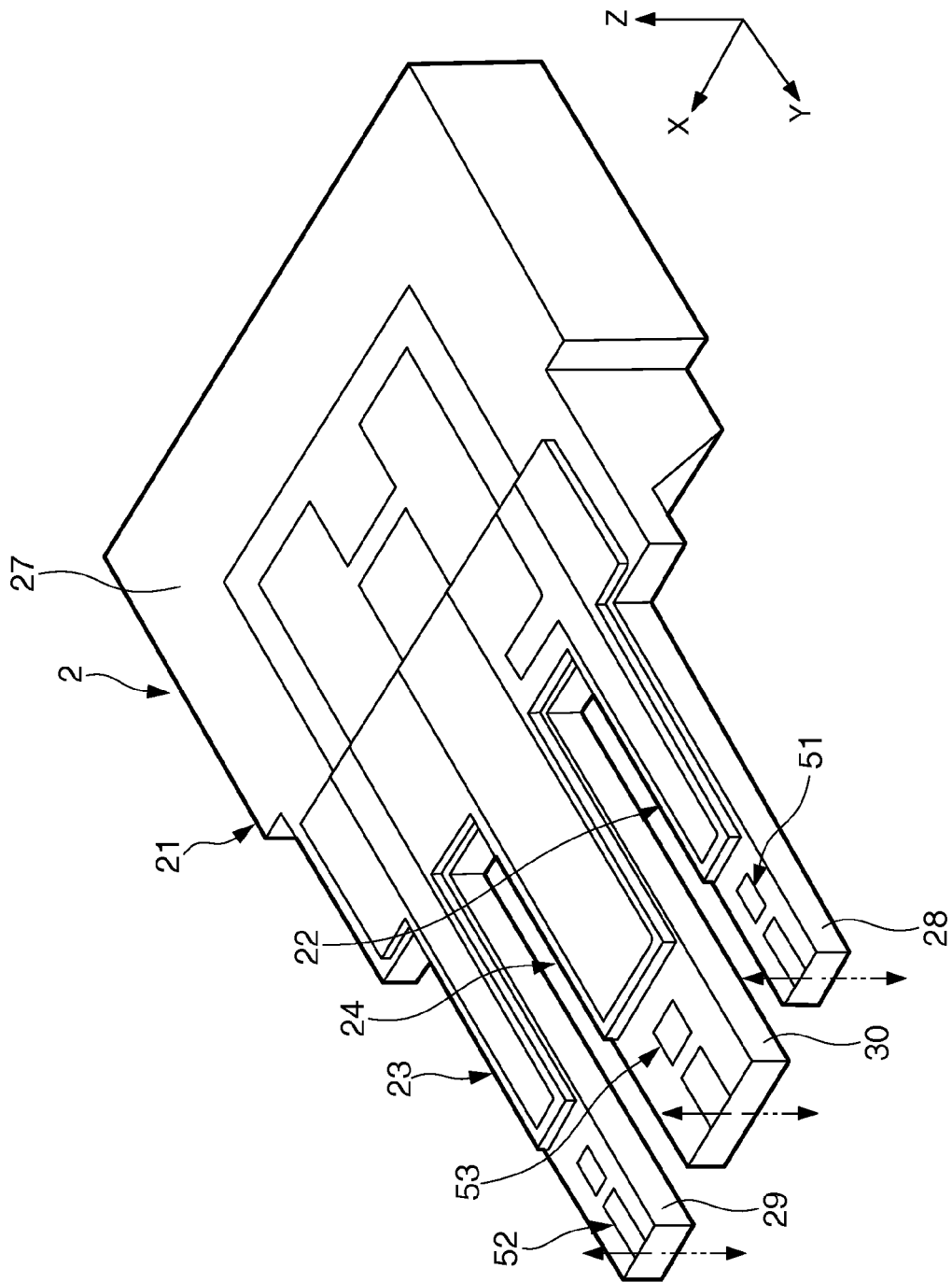
FIG. 6 is a perspective view for explaining the motion of the vibrator element shown in FIG. 2.

FIG. 1 is a cross-sectional view showing the vibrator according to a first embodiment of the invention, FIG. 2 is a top view showing the vibrator shown in FIG. 1, FIG. 3 is a bottom view showing the vibrator element provided to the vibrator shown in FIG. 1, FIG. 4A is a cross-sectional view along the line A-A in FIG. 2, FIG. 4B is a cross-sectional view along the line B-B in FIG. 2, FIGS. 5A and 5B are partial enlarged views (FIG. 5A is a top view, and FIG. 5B is a cross-sectional view along the line C-C in FIG. 5A) for explaining a first mass section and a second mass section shown in FIG. 4A, FIG. 6 is a perspective view for explaining the motion of the vibrator element shown in FIG. 2, and FIGS. 7A through 7C is a diagram for explaining an adjustment method of the frequency of the vibrator element shown in FIG. 6. It should be noted that in each of the drawings, the X-axis, the Y-axis, and the Z-axis are shown as the three axes perpendicular to each other for the sake of convenience of explanation. Further, hereinafter, a direction (a first direction) parallel to the Y-axis is referred to as a "Y-axis direction," a direction (a second direction) parallel to the X-axis is referred to as an "X-axis direction," and a direction (a normal direction of a plane including the first direction and the second direction) parallel to the Z-axis is referred to as a "Z-axis direction." Further, the upper side of FIG. 1 is referred to as an "upper side," the lower side thereof is referred to as a "lower side," the right side thereof is referred to as a "right side," and the left side thereof is referred to as a "left side" in the following descriptions for the sake of convenience of explanation.

The vibrator 1 shown in FIG. 1 has a vibrator element 2 and a package 3 housing the vibrator element 2.

Hereinafter, each of the sections constituting the vibrator 1 will sequentially be explained in detail.

Vibrator Element

Firstly, the vibrator element 2 will be explained.

The vibrator element 2 is a trident tuning fork vibrator element as shown in FIG. 2. The vibrator element 2 has a vibrator substrate 21, piezoelectric elements 22, 23, and 24 and connecting electrodes 41, 42 disposed on the vibrator substrate 21, first mass sections 51, 52, and 53, and second mass sections 54, 55, and 56.

The vibrator substrate 21 has a base section 27, and three vibrating arms 28, 29, and 30.

The constituent material of the vibrator substrate 21 is not particularly limited providing the material can exert desired vibration characteristics, and various types of piezoelectric material and various types of non-piezoelectric material can be used.

For example, as the piezoelectric materials, a quartz crystal, lithium tantalate, lithium niobate, lithium borate, and barium titanate can be cited. In particular, as the piezoelectric material constituting the vibrator substrate 21, a quartz crystal (an X-cut quartz crystal, an AT-cut quartz crystal, a Z-cut quartz crystal, and so on) is preferable. By constituting the vibrator substrate 21 with the quartz crystal (i.e., by constituting the base section 27 and the vibrating arms 28, 29, and 30 with the quartz crystal), it is possible to make the vibration characteristics (in particular the frequency-temperature characteristics) of the vibrator substrate 21 excellent. Further, it is possible to form the vibrator substrate 21 by etching with high dimensional accuracy.

Further, as the non-piezoelectric material, for example, silicon and quartz can be cited. In particular, silicon is preferable as the non-piezoelectric material constituting the vibrator substrate 21. By constituting the vibrator substrate 21 with silicon, the vibrator substrate 21 with superior vibration characteristics can be realized at relatively low cost. Further, it is also easy to integrate the vibrator element 2 and other circuit elements with each other by, for example, providing the integrated circuit to the base section 27. Further, it is possible to form the vibrator substrate 21 by etching with high dimensional accuracy.

In such a vibrator substrate 21, the base section 27 has a substantially plate-like shape with the Z-axis direction as the thickness direction. Further, as shown in FIGS. 1 and 3, the base section 27 has a thin wall section 271 and a thick wall section 272 formed to have a larger thickness than the thin wall section 271 so as to be arranged in the Y-axis direction.

Further, the thin wall section 271 is formed so as to have the same thickness as each of the vibrating arms 28, 29, and 30 described later. Therefore, the thick wall section 272 corresponds to the portion having the thickness in the Z-axis direction larger than the thickness in the Z-axis direction of vibrating arms 28, 29, and 30.

By forming such a thin wall section 271 and such a thick wall section 272, it is possible to reduce the thickness of the vibrating arms 28, 29, and 30 to thereby improve the vibration characteristics of the vibrating arms 28, 29, and 30, and at the same time, make the handling ability in manufacturing the vibrator element 2 excellent.

Further, the three vibrating arms 28, 29, and 30 are connected to the thin wall section 271 of the base section 27 on the opposite side thereof to the side of the thick wall section 272.

The vibrating arms 28, 29 are connected to the base section 27 (the thin wall section 271) at both end portions thereof in the X-axis direction, and the vibrating arm 30 is connected to the base section 27 (the thin wall section 271) at the center portion thereof in the X-axis direction.

The three vibrating arms 28, 29, and 30 are disposed so as to extend from the base section 27 in parallel to each other. More specifically, the three vibrating arms 28, 29, and 30 are disposed so as to extend from the base section 27 in the Y-axis direction (the direction of the Y-axis arrow) and to be arranged in the X-axis direction.

The vibrating arms 28, 29, and 30 each have an elongated shape, the end portion (base portion) thereof on the side of the base section 27 corresponds to the fixed end, and the end portion (tip portion) thereof on the opposite side to the base section 27 corresponds to the free end.

Further, each of the vibrating arms 28, 29, and 30 has a constant width throughout the entire area in the longitudinal direction. It should be noted that each of the vibrating arms 28, 29, and 30 can have a portion having a different width.

Further, the vibrating arms 28, 29, and 30 are formed so as to have respective lengths equal to each other. It should be noted that the respective lengths of the vibrating arms 28, 29, and 30 are set in accordance with the widths, the thicknesses, and so on of the respective vibrating arms 28, 29, and 30, and can therefore be different from each other.

It should be noted that it is also possible to provide a mass section (a hammer head) having a larger lateral cross-sectional area than the base portion to the tip portion of each of the vibrating arms 28, 29, and 30 according to needs. On this occasion, it is possible to reduce the size of the vibrator element 2, and to lower the frequency of the flexural vibration of the vibrating arms 28, 29, and 30.

As shown in FIG. 4A, the first mass section 51 is disposed on the upper surface 281 of such a vibrating arm 28, and the second mass section 54 is disposed on the lower surface 282 of the vibrating arm 28. The first mass section 51 and the second mass section 54 are each for being partially or fully removed by, for example, irradiation with an energy beam to reduce the mass to thereby adjust the resonant frequency of the vibrating arm 28. Similarly, the first mass section 52 is disposed on the upper surface 291 of the vibrating arm 29, and the second mass section 55 is disposed on the lower surface 292 of the vibrating arm 29. Further, the first mass section 53 is disposed on the upper surface 301 of the vibrating arm 30, and the second mass section 56 is disposed on the lower surface 302 of the vibrating arm 30.

It should be noted that the first mass sections 51, 52, and 53, and the second mass sections 54, 55, and 56 will be described later in detail.

Further, as shown in FIG. 4B, the piezoelectric element 22 is disposed on such a vibrating arm 28, further the piezoelectric element 23 is disposed on the vibrating arm 29, and further the piezoelectric element 24 is disposed on the vibrating arm 30. Thus, the vibrating arms 28, 29, and 30 can be made to perform the flexural vibration in the Z-axis direction with relative ease and efficiency even in the case in which the vibrating arms 28, 29, and 30 themselves have no piezoelectric property, or in the case in which the directions of the polarization axis and the crystal axis are not suitable for the flexural vibration in the Z-axis direction although the vibrating arms 28, 29, and 30 have the piezoelectric property. Further, since whether or not the vibrating arms 28, 29, and 30 have the piezoelectric property and the directions of the polarization axis and the crystal axis are made irrelevant, the range of choice of the material of the vibrating arms 28, 29, and 30 is broadened. Therefor, the vibrator element 2 having the desired vibration characteristics can be realized with relative ease.

The piezoelectric element 22 has a function of extending and compressing in response to the energization to thereby make the vibrating arm 28 perform the flexural vibration in the Z-axis direction. Further, the piezoelectric element 23 has a function of extending and compressing in response to the energization to thereby make the vibrating arm 29 perform the flexural vibration in the Z-axis direction. Further, the piezoelectric element 24 has a function of extending and compressing in response to the energization to thereby make the vibrating arm 30 perform the flexural vibration in the Z-axis direction.

As described in FIG. 4B, such a piezoelectric element 22 is composed of a first electrode layer 221, a piezoelectric layer (a piezoelectric thin film) 222, and a second electrode layer 223 stacked on the vibrating arm 28 in this order.

Similarly, the piezoelectric element 23 is composed of a first electrode layer 231, a piezoelectric layer (a piezoelectric thin film) 232, and a second electrode layer 233 stacked on the vibrating arm 29 in this order. Further, the piezoelectric element 24 is composed of a first electrode layer 241, a piezoelectric layer (a piezoelectric thin film) 242, and a second electrode layer 243 stacked on the vibrating arm 30 in this order.

Hereinafter, each of the layers constituting the piezoelectric element 22 will sequentially be explained in detail. It should be noted that the configurations of each of the layers of the piezoelectric elements 23, 24 are substantially the same as in the piezoelectric element 22, and therefore, the explanation therefor will be omitted.

First Electrode Layer

The first electrode layer 221 is disposed from the surface of the base section 27 to the surface of the vibrating arm 28 along the extending direction (the Y-axis direction) of the vibrating arm 28.

In the present embodiment, the length of the first electrode layer 221 on the vibrating arm 28 is set to be shorter than the length of the vibrating arm 28.

Further, in the present embodiment, the length of the first electrode layer 221 is set to be about two thirds of the length of the vibrating arm 28. It should be noted that the length of the first electrode layer 221 can be set to be about ⅓ through 1 of the length of the vibrating arm 28.

Such a first electrode layer 221 can be made of a metal material such as gold (Au), gold alloy, platinum (Pt), aluminum (Al), aluminum alloy, silver (Ag), silver alloy, chromium (Cr), chromium alloy, copper (Cu), molybdenum (Mo), niobium (Nb), tungsten (W), iron (Fe), titanium (Ti), cobalt (Co), zinc (Zn), or zirconium (Zr).

Among these materials, as the constituent material of the first electrode layer 221, the metal (gold and gold alloy) containing gold as the principal material, and platinum is preferably used, and the metal (in particular gold) containing gold as the principal material is further preferably used.

Gold (Au) is superior (low in electrical resistance) in conductivity, and superior in resistance characteristics to oxidation, and is therefore preferable as the electrode material. Further, gold (Au) can easily be patterned by etching compared to platinum (Pt). Further, by forming the first electrode layer 221 with gold or gold alloy, the orientation of the piezoelectric layer 222 can also be improved.

Further, the average thickness of the first electrode layer 221 is not particularly limited, but is preferably in a range of about 1 through 300 nm, and is further preferably in a range of 10 through 200 nm. Thus, it is possible to make the conductivity of the first electrode layer 221 described above excellent while preventing the first electrode layer 221 from exerting a harmful influence on the drive characteristics of the piezoelectric element 22 and the vibration characteristics of the vibrating arm 28.

It should be noted that if the first electrode layer 221 is made of gold, for example, and the vibrator substrate 21 is made of quartz crystal, the adhesiveness therebetween is low. Therefore, in such a case, it is preferable to provide a foundation layer made of Ti, Cr, or the like between the first electrode layer 221 and the vibrator substrate 21. Thus, the adhesiveness between the foundation layer and the vibrating arm 28 and the adhesiveness between the foundation layer and the first electrode layer 221 can be made excellent. As a result, it is possible to prevent the first electrode layer 221 from exfoliating from the vibrating arm to thereby make the reliability of the vibrator element 2 excellent.

The average thickness of the foundation layer is not particularly limited providing the foundation layer can exert the effect of improving the adhesiveness described above while preventing the harmful influence from being exerted on the drive characteristics of the piezoelectric element 22 and the vibration characteristics of the vibrating arm 28, but is preferably in a range of, for example, about 1 through 300 nm.

Piezoelectric Layer

The piezoelectric layer 222 is disposed on the first electrode layer 221 along the extending direction (the Y-axis direction) of the vibrating arm 28.

Further, the length of the piezoelectric layer 222 in the extending direction (the Y-axis direction) of the vibrating arm 28 is roughly equal to the length of the first electrode layer 221 in the same direction (the Y-axis direction).

Thus, it is possible to improve the orientation of the piezoelectric layer 222 throughout the entire area of the piezoelectric layer 222 in the Y-axis direction due to the surface condition of the first electrode layer 221 as described above. Therefore, it is possible to homogenize the piezoelectric layer 222 in the longitudinal direction (the Y-axis direction) of the vibrating arm 28.

Further, the end portion (i.e., the base portion of the piezoelectric layer 222) of the piezoelectric layer 222 located on the side of the base section 27 is provided so as to straddle the boundary portion between the vibrating arm 28 and the base section 27. Thus, it is possible to efficiently transmit the drive force of the piezoelectric element 22 to the vibrating arm 28. Further, it is possible to reduce the rapid change in rigidity in the boundary portion between the vibrating arm 28 and the base section 27. Therefore, the Q-value of the vibrator element 2 can be improved.

As the constituent material (the piezoelectric material) of such a piezoelectric layer 222, zinc oxide (ZnO), aluminum nitride (AlN), lithium tantalate (LiTaO$_3$), lithium niobate (LiNbO$_3$), potassium niobate (KNbO$_3$), lithium tetraborate (Li$_2$B$_4$O$_7$), bariumtitanate (BaTiO$_3$), lead zirconium titanate (PZT) can be cited, for example, and AlN and ZnO are used preferably.

Among these materials, ZnO and AlN are preferably used as the constituent material of the piezoelectric layer 222. Zinc oxide (ZnO) and aluminum nitride (AlN) are superior in c-axis orientation. Therefore, by forming the piezoelectric layer 222 using ZnO as the principal material, the CI-value of the vibrator element 2 can be reduced. Further, these materials can be deposited by a reactive sputtering method.

Further, the average thickness of the piezoelectric layer 222 is preferably in a range of about 50 through 3000 nm, and further preferably in a range of about 200 through 2000 nm. Thus, it is possible to make the drive characteristics of the piezoelectric element 22 excellent while preventing the piezoelectric layer 222 from exerting a harmful influence on the vibration characteristics of the vibrating arm 28.

Second Electrode Layer

The second electrode layer 223 is disposed on the piezoelectric layer 222 along the extending direction (the Y-axis direction) of the vibrating arm 28.

Further, the length of the second electrode layer 223 in the extending direction (the Y-axis direction) of the vibrating arm 28 is roughly equal to the length of the piezoelectric layer 222. Thus, it is possible to extend and compress the entire area of the piezoelectric layer 222 in the extending direction (the Y-axis direction) of the vibrating arm 28 due to the electrical field generated between the second electrode layer 223 and the first electrode layer 221 described above. Therefore, the vibration efficiency can be enhanced.

Such a second electrode layer 223 can be made of a metal material such as gold (Au), gold alloy, platinum (Pt), aluminum (Al), aluminum alloy, silver (Ag), silver alloy, chromium (Cr), chromium alloy, copper (Cu), molybdenum (Mo), niobium (Nb), tungsten (W), iron (Fe), titanium (Ti), cobalt (Co), zinc (Zn), or zirconium (Zr). In particular, similarly to the first electrode layer 221, as the constituent material of the second electrode layer 223, the metal (gold and gold alloy) containing gold as the principal material, and platinum is preferably used, and the metal (in particular gold) containing gold as the principal material is further preferably used.

Further, the average thickness of the second electrode layer 223 is not particularly limited, but is preferably in a range of about 1 through 300 nm, and is further preferably in a range of 10 through 200 nm. Thus, it is possible to make the conductivity of the second electrode layer 223 excellent while preventing the second electrode layer 223 from exerting a harmful influence on the drive characteristics of the piezoelectric element 22 and the vibration characteristics of the vibrating arm 28.

It should be noted that an insulator layer made of silicon oxide (SiO$_2$), aluminum nitride (AlN), or the like can be disposed between the piezoelectric layer 222 and the second electrode layer 223 according to needs. The insulator layer has a function of protecting the piezoelectric layer 222, and at the same time preventing the short circuit between the first electrode layer 221 and the second electrode layer 223. Further, the insulator layer can be formed so as to cover only the upper surface of the piezoelectric layer 222, or to cover the upper surface of the piezoelectric layer 222 and the side surfaces (the surfaces other than the surface having contact with the first electrode layer 221) of the piezoelectric layer 222.

Further, the average thickness of the insulator layer is not particularly limited, but is preferably in a range of 50 through 500 nm. If the thickness is smaller than the lower limit value, the effect of preventing the short circuit described above tends to be weaker, and if the thickness exceeds the upper limit value on the other hand, there is a possibility of exerting a harmful influence on the characteristics of the piezoelectric element 22.

In such a piezoelectric element 22, if a voltage is applied between the first electrode layer 221 and the second electrode layer 223, an electrical field in the Z-axis direction is generated in the piezoelectric layer 222. Due to this electrical field, the piezoelectric layer 222 extends or compresses in the Y-axis direction to thereby make the vibrating arm 28 perform the flexural vibration in the Y-axis direction.

Similarly, in the piezoelectric element 23, if a voltage is applied between the first electrode layer 231 and the second electrode layer 233, the piezoelectric layer 232 extends or compresses in the Y-axis direction to thereby make the vibrating arm 29 perform the flexural vibration in the Z-axis direction. Further, in the piezoelectric element 24, if a voltage is applied between the first electrode layer 241 and the second electrode layer 243, the piezoelectric layer 242 extends or compresss in the Y-axis direction to thereby make the vibrating arm 30 perform the flexural vibration in the Z-axis direction.

In such piezoelectric elements 22, 23, and 24, the first electrode layers 221, 231 described above are electrically connected to the second electrode layer 243 via a conducting section composed of a through electrode and wiring not shown. Further, as shown in FIG. 2, the second electrode layer 243 is electrically connected to the connecting electrode 41 disposed on the upper surface of the base section 27. Thus, the first electrode layers 221, 231 and the second electrode layer 243 are each electrically connected to the connecting electrode 41.

Further, the first electrode layer 241 is electrically connected to the second electrode layers 223, 233 via the conducting section composed of a through electrode and wiring not shown. Further, as shown in FIG. 2, the second electrode layers 223, 233 are electrically connected to the connecting electrode 42 disposed on the upper surface of the base section 27 via the wiring 43. Thus, the first electrode layer 241 and the second electrode layers 223, 233 are electrically connected to the connecting electrode 42.

Further, the connecting electrodes 41, 42, the wiring 43, and so on can be made of a metal material such as gold (Au), gold alloy, platinum (Pt), aluminum (Al), aluminum alloy, silver (Ag), silver alloy, chromium (Cr), chromium alloy, copper (Cu), molybdenum (Mo), niobium (Nb), tungsten (W), iron (Fe), titanium (Ti), cobalt (Co), zinc (Zn), or zirconium (Zr). Further, these components can be formed simultaneously in a lump together with the first electrode layers 221, 231, and 241 or the second electrode layers 223, 233, and 234.

In the vibrator element 2 having such a configuration, when the voltage (the voltage for vibrating each of the vibrating arms 28, 29, and 30) is applied between the connecting electrode 41 and the connecting electrode 42, the voltages in the Z-axis direction are respectively applied to the piezoelectric layers 222, 223, and 224 in a condition in which a first group including the first electrode layers 221, 231 and the second electrode layer 243 and a second group including the first electrode layer 241 and the second electrode layers 223, 233 have the respective polarities reverse to each other. Thus, due to the inverse piezoelectric effect of the piezoelectric material, it is possible to make the vibrating arms 28, 29, and 30 perform the flexural vibration at a certain constant frequency (a resonant frequency). On this occasion, as shown in FIGS. 5A and 5B, the vibrating arms 28, 29 perform the flexural vibration in the same direction, and the vibrating arm 30 performs the flexural vibration in the opposite direction to the vibrating arms 28, 29.

By making the vibrating arms adjacent to each other perform the flexural vibration in the directions opposite to each other, it is possible to cancel out the leakage vibrations generated by the vibrating arms 28, 30 (29, 30) adjacent to each other. As a result, the vibration leakage can be prevented.

Further, when each of the vibrating arms 28, 29, and 30 performs the flexural vibration, the voltage is generated between the connecting electrodes 41, 42 at a certain frequency due to the piezoelectric effect of the piezoelectric material. By utilizing the properties described above, the vibrator element 2 can generate an electrical signal vibrating at the resonant frequency.

First Mass Section and Second Mass Section

Here, the first mass section 51 and the second mass section 54 disposed on the vibrating arm 28 will be described in detail. It should be noted that the first mass section 52 and the second mass section 55 disposed on the vibrating arm 29, and the first mass section 53 and the second mass section 56 disposed on the vibrating arm 30 are the same as the first mass section 51 and the second mass section 54, and therefore the explanation therefor will be omitted.

As described above, the first mass section 51 is disposed on the upper surface 281 of the vibrating arm 28, and the second mass section 54 is disposed on the lower surface 282 of the vibrating arm 28. Here, the upper surface 281 and the lower surface 282 of the vibrating arm 28 are the planes having the Z-axis direction (i.e., the direction in which the vibrating arm 28 performs the flexural vibration) as the normal lines, and are opposed to each other. In the present embodiment, the vibrating arm 28 has a plate-like shape, and the pair of plate surfaces thereof form the upper surface 281 (a first surface) and the lower surface 282 (a second surface), respectively. Further, the upper surface 281 extends or compresses due to the flexural vibration of the vibrating arm 28 in the Z-axis direction, and the lower surface 282 extends when the upper surface 281 compresses, and compresses when the upper surface 281 extends.

In particular, the first mass section 51 and the second mass section 54 have respective portions not overlap each other viewed from the Z-axis direction (i.e., in a plan view). Specifically, it can also be said that the first mass section 51 is disposed on the first surface (the upper surface 281) and the second mass section 54 is disposed on the second surface (the lower surface 282), the first mass section 51 and the second mass section 54 have the respective portions asymmetrical to each other viewed from the normal direction (i.e., the Z-axis direction) of the upper surface 281 or the lower surface 282 in a plan view.

Thus, it is possible to remove the first mass section 51 and the second mass section 54 separately (selectively) in accordance with, for example, the irradiation position with the energy beam. Therefore, the elimination quantities of the first mass section 51 and the second mass section 54 can be adjusted with high accuracy. Therefore, the adjustment of the frequency (the resonant frequency) can be performed with ease and high accuracy.

In a more specific explanation, the first mass section 51 is composed of a mass section 511, and a mass section 512 disposed nearer to the base portion of the vibrating arm 28 than the mass section 511.

The mass section 511 and the mass section 512 are each disposed at the center portion in the X-axis direction on the upper surface 281 of the vibrating arm 28.

In the present embodiment, the mass sections 511, 512 each have a strip shape (rectangle) having the Y-axis direction as the longitudinal direction. Further, the mass sections 511, 512 are arranged to have the same width. Further, the length of the mass section 511 in the Y-axis direction is set to be longer than the length of the mass section 512 in the Y-axis direction.

Further, the mass section 511 and the mass section 512 are separate from each other in the Y-axis direction. The distance is not particularly limited, but is preferably equal to or longer than a half (in particular equal to or larger than 1) of the irradiation area (in particular the spot size of the laser beam) of the energy beam used for frequency adjustment described later.

On the other hand, the second mass section 54 is composed of mass sections 541, 542 and mass sections 543, 544 disposed nearer to the base portion of the vibrating arm 28 than the mass sections 541, 542.

The mass section 541 and the mass section 543 are separately disposed at one end portion (the left end portion in FIGS. 5A and 5B) in the X-axis direction on the upper surface 281 of the vibrating arm 28, and on the other hand, the mass section 542 and the mass section 544 are separately disposed at the other end portion (the right end portion in FIGS. 5A and 5B) in the X-axis direction on the upper surface 281 of the vibrating arm 28.

In the present embodiment, the mass sections 541, 542, 543, and 544 each have a strip shape (rectangle) having the Y-axis direction as the longitudinal direction. Further, the mass sections 541, 542, 543, and 544 are arranged to have the same width. Further, the length of each of the mass sections 541, 542 in the Y-axis direction is arranged to be equal to the length of the mass section 511 of the first mass section 51 in the Y-axis direction. Further, the length of each of the mass sections 543, 544 in the Y-axis direction is arranged to be equal to the length of the mass section 512 of the first mass section 51 in the Y-axis direction.

Further, the mass section 541 and the mass section 543 are separate from each other in the Y-axis direction. Further, the mass section 542 and the mass section 544 are separate from each other in the Y-axis direction. The distances are not particularly limited, but are each preferably equal to or longer than a half (in particular equal to or larger than 1) of the irradiation area (in particular the spot size of the laser beam) of the energy beam used for frequency adjustment described later.

Further, the mass section 541 and the mass section 542 are separate from each other in the X-axis direction. Further, the mass section 543 and the mass section 544 are separate from each other in the X-axis direction. The distances are each arranged to be longer than the length of the mass sections 511, 512 of the first mass section 51 described above in the X-axis direction.

The first mass section 51 and the second mass section 54 described above are disposed so as not to overlap each other in the X-axis direction viewed from the Z-axis direction. In other words, it can also be said that the first mass section 51 and the second mass section 54 have the respective portions formed adjacent to each other in the X-axis direction (the second direction) in a plan view viewed from the Z-axis direction (the normal direction of the upper surface 281 or the lower surface 282). Thus, it is possible to make the range of the first mass section 51 in the Y-axis direction and the range of the second mass section 54 in the Y-axis direction be matched or overlap each other. Therefore, it is possible to reduce the length the first mass section 51 and the second mass section 54 occupy in the vibrating arm 28 in the longitudinal direction (the Y-axis direction). It should be noted that it is also possible that the first mass section 51 and the second mass section 54 partially overlap each other (in e.g., edge portions of the mass sections) in the vicinity of the boundary between the first mass section 51 and the second mass section 54 viewed from the Z-axis direction.

Further, when viewed from the Z-axis direction, the mass sections 511, 512 of the first mass section 51 and the mass sections 541, 543 of the second mass section 54 are disposed with a distance in the X-axis direction, and similarly, the mass sections 511, 512 of the first mass section 51 and the mass sections 542, 544 of the second mass section 54 are disposed with a distance in the X-axis direction. Thus, when applying the energy beam as described later, the mass sections can separately be removed. Here, the distances are not particularly limited, but are each preferably equal to or longer than a half (in particular equal to or larger than 1) of the irradiation area (in particular the spot size of the laser beam) of the energy beam used for frequency adjustment described later.

Further, the first mass section 51 and the second mass section 54 are separately disposed on the tip portion side (in the vicinity of the tip) of the vibrating arm 28. Thus, it is possible to increase the variation in the frequency (the resonant frequency) of the vibrating arm 28 with respect to the elimination quantity of the first mass section 51 and the second mass section 54. Therefore, the frequency adjustment can efficiently be performed. Further, the tip portion of the vibrating arm 28 is not provided with the piezoelectric element 22 described above, and can therefore be efficiently used for disposing the first mass section 51 and the second mass section 54. Therefore, reduction in length of the vibrating arm 28, and therefore, downsizing of the vibrator element 2 can be achieved.

Further, the range of the first mass section 51 in the Y-axis direction and the range of the second mass section 54 in the Y-axis direction are matched each other. Thus, reduction in length of the vibrating arm 28, and therefore, downsizing of the vibrator element 2 can be achieved.

The constituent material of the first mass section 51 and the second mass section 54 described above is not particularly limited providing the material can be deposited on the vibrating arm 28, and a resin material, a metal material, and a ceramics material, for example, can be used. Further, the material the same as the constituent material of the piezoelectric layer 222 can also be used as the constituent material of the first mass section 51 and the second mass section 54.

In particular, the metal material or the ceramics material is preferable as the constituent material of the first mass section 51 and the second mass section 54 described above. In other words, it is preferable to form each of the first mass section 51 and the second mass section 54 by depositing metal or ceramics.

The metal or the ceramics (an insulating material) can be deposited by a vapor-phase deposition method with ease and high accuracy. Further, the film (the weight film) made of metal or ceramics can be removed by irradiation with the energy beam (particularly a laser beam) with ease and high accuracy. Therefore, by forming each of the first mass section 51 and the second mass section 54 by depositing metal or ceramics, the frequency adjustment can be easier and highly accurate.

As such a metal material, similarly to the constituent materials of the first electrode layer 221 and the second electrode layer 223, gold (Au), gold alloy, platinum (Pt), aluminum (Al), aluminum alloy, silver (Ag), silver alloy, chromium (Cr), chromium alloy, copper (Cu), molybdenum (Mo), niobium (Nb), tungsten (W), iron (Fe), titanium (Ti), cobalt (Co), zinc (Zn), zirconium (Zr), and so on can be cited, and either one of these materials alone or a combination of two or more of these materials can be used. Among these materials, as the metal material, it is preferable to use either one or an alloy including at least one of Al, Cr, Fe, Ni, Cu, Ag, Au, or Pt.

Further, as the ceramics used as the constituent material of the first mass section 51 and the second mass section 54, there can be cited various types of glass, oxide ceramics such as alumina (aluminum oxide), silica (silicon dioxide), titania (titanium oxide), zirconia, yttria, or calcium phosphate, nitride ceramics such as silicon nitride, aluminum nitride, titanium nitride, or boron nitride, carbide ceramics such as graphite or tungsten carbide, or other ferroelectric materials such as barium titanate, strontium titanate, PZT, PLZT, PLLZT. Among these materials, as the ceramics described above, an insulating material such as titanium oxide ($TiO_2$) or aluminum oxide ($Al_2O_3$) is preferably used.

Further, the constituent material used in the first mass section 51 and the constituent material used in the second mass section 54 are preferably different from each other. Thus, it is possible to make the specific gravity of the constituent material of the first mass section 51 and the specific gravity of the constituent material of the second mass section 54 different from each other. As a result, it is possible to make the variation in the frequency (the resonant frequency) of the vibrating arm 28 with respect to the elimination quantity of the first mass section 51 and the variation in the frequency (the resonant frequency) of the vibrating arm 28 with respect to the elimination quantity of the second mass section 54 different from each other. Therefore, by using one of the first mass section 51 and the second mass section 54 for the coarse adjustment, and the other thereof for the fine adjustment, the frequency adjustment can be easier and highly accurate.

Further, it is preferable that the first mass section 51 is made of a material having a specific gravity larger than the constituent material of the second mass section 54. In other words, it is preferable that the second mass section 54 is made of a material having a specific gravity smaller than the constituent material of the first mass section 51. More specifically, in the case of constituting the first mass section 51 and the second mass section 54 with the respective metal materials, it is preferable to constitute the first mass section 51 with Au, Pt, Ag, or an alloy of these metals, and constitute the second mass section 54 with Al, Al alloy, or the like.

Thus, it is possible to make the variation (the amount of rise) in the frequency (the resonant frequency) of the vibrating arm 28 with respect to the elimination quantity of the first mass section 51 larger than the variation (the amount of rise) in the frequency (the resonant frequency) of the vibrating arm 28 with respect to the elimination quantity of the second mass section 54. Therefore, by using the first mass section 51 for the coarse adjustment, and the second mass section 54 for the fine adjustment, the frequency adjustment can be easier and highly accurate.

Further, in the present embodiment, since the second mass section 54 is located on the both end portions of the vibrating arm 28 in the X-axis direction, by using the second mass section 54 for the fine adjustment, the vibration characteristics of the vibrating arm 28 can be prevented from becoming imbalanced between the both end portions in the X-axis direction.

Further, from the viewpoint similar to the specific gravity described above, the density of the first mass section 51 is preferably higher than the density of the second mass section 54. In other words, it is preferable that density of the second mass section 54 is lower than the density of the first mass section 51. For example, by constituting the second mass section 54 with a porous body, the density of the second mass section 54 can be made lower than the density of the first mass section 51 even if the same constituent material is used as the first mass section 51 and the second mass section 54.

Further, it is preferable that the thickness (the average thickness) of the first mass section 51 is larger than the thickness (the average thickness) of the second mass section 54. In other words, it is preferable that the thickness (the average thickness) of the second mass section 54 is smaller than the thickness (the average thickness) of the first mass section 51.

Thus, it is possible to make the variation (the amount of rise) in the frequency (the resonant frequency) of the vibrating arm 28 with respect to the elimination quantity of the first mass section 51 larger than the variation (the amount of rise) in the frequency (the resonant frequency) of the vibrating arm 28 with respect to the elimination quantity of the second mass section 54. Therefore, by using the first mass section 51 for the coarse adjustment, and the second mass section 54 for the fine adjustment, the frequency adjustment can be easier and highly accurate.

Further, in the present embodiment, since the second mass section 54 is located on the both end portions of the vibrating arm 28 in the X-axis direction, by using the second mass section 54 for the fine adjustment, the vibration characteristics of the vibrating arm 28 can be prevented from becoming imbalanced between the both end portions in the X-axis direction.

Further, the thickness (the average thickness) of the first mass section 51 is preferably equal to or larger than the thickness (the average thickness) of the second mass section 54 and equal to or smaller than ten times of the thickness of the second mass section 54, and is further preferably equal to or larger than the thickness of the second mass section 54 and equal to or smaller than eight times of the thickness of the second mass section 54.

Further, the thickness (the average thickness) of each of the first mass section 51 and the second mass section 54 is not particularly limited, but is preferably in a range of about 1 through 1000 nm. Thus, the first mass section 51 and the second mass section 54 having the thickness defined with high accuracy can easily be obtained.

Frequency Adjustment Method

Then, the frequency adjustment method of the vibrator element 2 configured as described above will be explained with reference to FIGS. 7A through 7C. It should be noted that the case of using the first mass section 51 for the coarse adjustment and the second mass section 54 for the fine adjustment will be explained as an example. Further, although the frequency adjustment for the vibrating arm 28 will be explained as a representative, the frequency adjustment for the vibrating arms 29, 30 is the same as the frequency adjustment for the vibrating arm 28.

The frequency adjustment method for the vibrator element 2 has a first process of preparing the vibrator element 2 (on which no frequency adjustment has been performed), and a second process of removing a part or the whole of at least one of the first mass section 51 and the second mass section 54 by irradiation with the energy beam to thereby reducing the mass of the mass section, thereby adjusting the resonant frequency of the vibrating arm 28.

Hereinafter, each of the first and second processes will sequentially be described.

First Process

Firstly, the vibrator element 2 on which the frequency adjustment has not been performed (non-adjusted) is prepared.

Figure 7A:
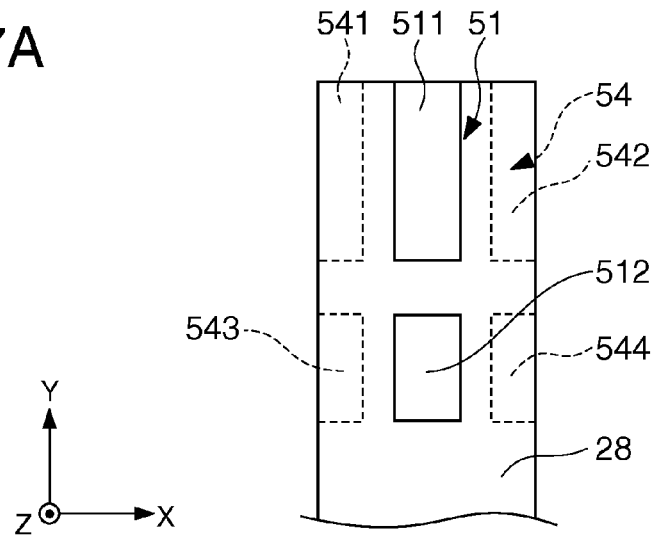
FIGS. 7A through 7C are diagrams for explaining an adjustment method of the frequency of the vibrator element shown in FIG. 6.

On this occasion, as shown in FIG. 7A, on the vibrating arm 28 there are disposed the first mass section 51 composed of the mass section 511, 512 described above, and the second mass section 54 composed of the mass sections 541, 542, 543, and 544 described above.

Further, on this occasion, the frequency (the resonant frequency) of the vibrating arm 28 is set to be lower than the target frequency (the resonant frequency).

Second Process

Coarse Adjustment

Then, the coarse adjustment of the frequency is performed first.

Figure 7B:
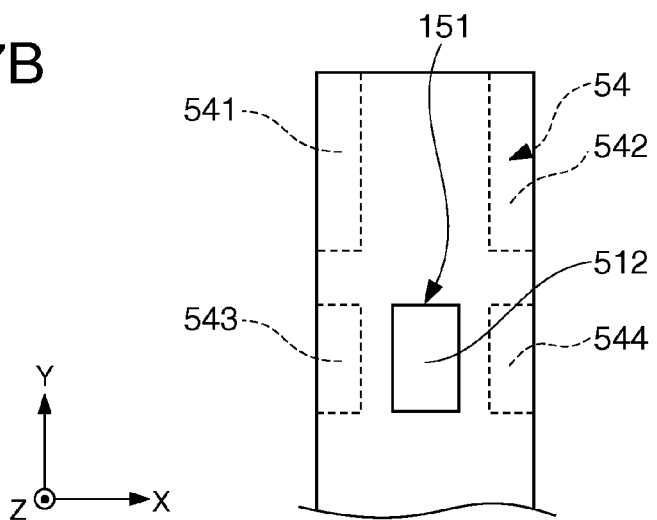

Specifically, as shown in FIG. 7B, a part or the whole of the first mass section 51 is removed by irradiation with the energy beam according to needs.

In FIG. 7B, the case of removing the whole of the mass section 511 of the first mass section 51 is shown as an example. Therefore, the first mass section 151 obtained by performing the coarse adjustment and composed of the mass section 512 is disposed on the vibrating arm 28 after the irradiation with the energy beam. It should be noted that the shape, the region, and the amount of the first mass section 51 removed in the coarse adjustment are appropriately set in accordance with needs, and is therefore not limited to those shown in the drawings. For example, in the case of removing a part of the mass section 511 by the irradiation with the laser beam, the portion of the first mass section 51 thus removed forms a line shape, a dot shape, and so on.

Since the first mass section 51 is reduced in the mass and is changed to the first mass section 151 by the coarse adjustment described above, the frequency of the vibrating arm 28 is raised. Further, the coarse adjustment is performed so that the frequency (the resonant frequency) of the vibrating arm 28 becomes slightly lower than the target frequency (the resonant frequency), thereby setting the frequency within the range in which the frequency can be adjusted by the fine adjustment described later. Specifically, the first mass section 51 is gradually removed by the irradiation with the energy beam until the frequency (the resonant frequency) of the vibrating arm 28 reaches the state slightly lower than the target frequency (the resonant frequency).

Further, the energy beam used for such coarse adjustment is not particularly limited providing the energy beam can remove the necessary region of the first mass section 51 without exerting a harmful influence on the vibrating arm 28, and a radiation ray, an electron beam, a laser beam, an ion beam, and so on can be cited. It is preferable to use a laser beam such as a carbon dioxide gas laser beam, an excimer laser beam, or a YAG laser beam. Thus, the desired amount of a part or the whole of the first mass section 51 can easily and surely be removed.

Fine Adjustment

Subsequently, the fine adjustment of the frequency is performed.

Figure 7C:
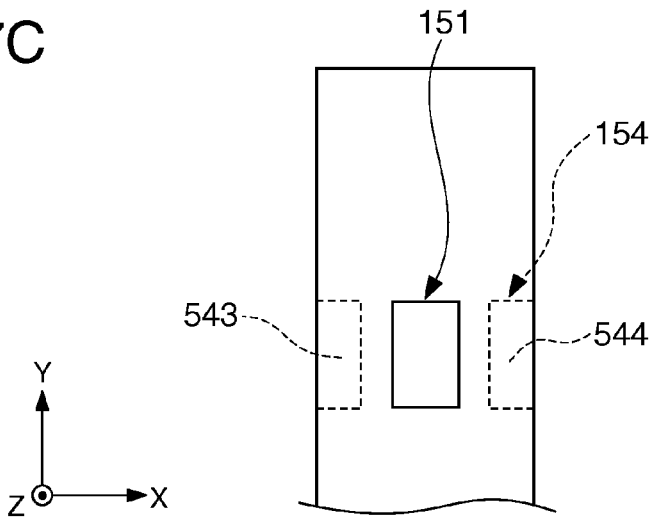

Specifically, as shown in FIG. 7C, apart or the whole of the second mass section 54 is removed by irradiation with the energy beam according to needs.

In FIG. 7C, the case of removing the whole of the mass sections 541, 542 of the second mass section 54 is shown as an example. Therefore, the second mass section 154 obtained by performing the fine adjustment and composed of the mass sections 543, 544 is disposed on the vibrating arm 28 after the irradiation with the energy beam. It should be noted that the shape, the region, and the amount of the second mass section 54 removed in the fine adjustment are appropriately set in accordance with needs, and is therefore not limited to those shown in the drawings. For example, in the case of removing a part of the mass section 541 by the irradiation with the laser beam, the portion of the second mass section 54 thus removed forms a line shape, a dot shape, and so on.

Since the second mass section 54 is reduced in the mass and is changed to the second mass section 154 by the fine adjustment described above, the frequency of the vibrating arm 28 is raised. Further, the fine adjustment is performed so that the frequency (the resonant frequency) of the vibrating arm 28 matches the target frequency (the resonant frequency). Specifically, the second mass section 54 is gradually removed by the irradiation with the energy beam until the frequency (the resonant frequency) of the vibrating arm 28 matches the target frequency (the resonant frequency).

Further, as the energy beam used for such fine adjustment, the energy beam similar to the energy beam to be used for the coarse adjustment described above can be used, and a laser beam such as a carbon dioxide gas laser beam, an excimer laser beam, or a YAG laser beam is preferably be used. Thus, the desired amount of a part or the whole of the second mass section 54 can easily and surely be removed.

According to the processes described above, the frequency of the vibrating arm 28 can be adjusted so as to match the target frequency. In particular, according to the frequency adjustment method described above, it is possible to remove the first mass section 51 and the second mass section 54 separately (selectively) in accordance with, for example, the irradiation position with the energy beam. Therefore, the adjustment of the frequency (the resonant frequency) can be performed with ease and high accuracy.

Method of Manufacturing Vibrator Element

Here, an example of the method of manufacturing the vibrator element 2 described above will briefly be explained.

The method of manufacturing the vibrator element 2 described above has a process A of forming the first electrode layers 221, 231, and 241, the first mass sections 51, 52, and 53, and the second mass sections 54, 55, and 56 on the vibrating arms 28, 29, and 30, respectively, a process B of forming the piezoelectric layers 222, 232, and 242 on the first electrode layers 221, 231, and 241, respectively, and a process C of forming the second electrode layers 223, 233, and 243 on the piezoelectric layers 222, 232, and 242, respectively.

Hereinafter, each of the processes will briefly be explained.

Process A

Firstly, a substrate for forming the vibrator substrate 21 is prepared.

Then, by etching the substrate, the vibrator substrate 21 is formed.

In a more specific explanation, in the case in which the substrate described above is a quartz crystal substrate, for example, the portion of the quartz crystal substrate to be the thin wall section 271 is partially removed with the anisotropic etching using buffered hydrogen fluoride (BHF) as the etching liquid to thereby be thinned. Subsequently, the portion thus thinned is partially removed with the anisotropic etching similar to the anisotropic etching described above to thereby form the vibrating arms 28, 29, and 30. Thus, the vibrator substrate 21 is formed.

Subsequently, the first electrode layers 221, 231, and 241, the first mass sections 51, 52, and 53, and the second mass sections 54, 55, and 56 are formed on the vibrating arms 28, 29, and 30, respectively. On this occasion, the wiring and so on are formed simultaneously if necessary.

As the forming method of the first electrode layers 221, 231, and 241, the first mass sections 51, 52, and 53, and the second mass sections 54, 55, and 56, a vapor-phase deposition method such as a sputtering method, a physical deposition method including vacuum vapor deposition method, or a chemical vapor deposition (CVD) method, and various types of coating method such as an ink-jet method can be cited, and the vapor-phase deposition method (in particular, the sputtering method, or the vacuum vapor deposition method) is preferably used. Further, in forming the first electrode layers 221, 231, and 241, a photolithography method is preferably used.

It should be noted that the first electrode layers 221, 231, and 241 can be formed in a lump in the same deposition process.

Process B

Then, the piezoelectric layers 222, 232, and 242 are formed on the first electrode layers 221, 231, and 241, respectively.

As the forming method of the piezoelectric layers 222, 232, and 242, a vapor-phase deposition method such as a sputtering method, a physical deposition method including vacuum vapor deposition method, or a chemical vapor deposition (CVD) method, and various types of coating method such as an ink-jet method can be cited, and the vapor-phase deposition method (in particular, a reactive sputtering method) is preferably used. Further, in forming (patterning) the piezoelectric layers 222, 232, and 242, a photolithography method is preferably used. Further, in patterning the piezoelectric layers 222, 232, and 242, a wet etching process is preferably used for removing unnecessary portions.

It should be noted that the piezoelectric layers 222, 232, and 242 can be formed in a lump by the same deposition process.

Process C

Subsequently, the second electrode layers 223, 233, and 243 are provided to the piezoelectric layers 222, 232, and 242, respectively. On this occasion, the connecting electrodes 41, 42 and so on are formed simultaneously.

The formation of the second electrode layers 223, 233, and 243 can be performed in a similar manner to the case of the first electrode layers 221, 231, and 241 described above.

Subsequently, the frequency adjustment described above is performed according to needs.

It should be noted that the frequency adjustment can be performed before housing the vibrator element 2 in the package 3, or can be performed after housing the vibrator element 2 in the package 3. Further, it is also possible to perform one of the frequency adjustment by the first mass sections 51, 52, and 53 and the frequency adjustment by the second mass sections 54, 55, and 56 before housing the vibrator element 2 in the package 3, and perform the other thereof after housing the vibrator element 2 in the package 3.

The vibrator element 2 can be manufactured in a manner as explained hereinabove. It should be noted that although in the example of the manufacturing method described above the first mass sections 51, 52, and 53, and the second mass sections 54, 55, and 56 are formed in a lump together with the first electrode layers 221, 231, and 241, the invention is not limited thereto, but the first and second mass sections can be formed in a lump together with the second electrode layers 223, 233, and 243. Further, the first mass sections 51, 52, and 53 can be composed of a layer deposited with the first electrode layers 221, 231, and 241, and a layer deposited with the second electrode layers 223, 233, and 243, the layers being stacked one another.

Package

Then, the package 3 for housing and fixing the vibrator element 2 will be explained.

As shown in FIG. 1, the package 3 has abase substrate 31 having a plate-like shape, a frame member 32 having a frame-like shape, and a lid member 33 having a plate-like shape. The base substrate 31, the frame member 32, and the lid member 33 are stacked from the lower side to the upper side in this order. The base substrate 31 and the frame member 32 are each made of a ceramic material described later or the like, and are integrally calcined to thereby be bonded to each other. Then, the frame member 32 and the lid member 33 are bonded to each other with, for example, an adhesive or a brazing material. Further, the package 3 houses the vibrator element 2 in an inner space 37 defined by the base substrate 31, the frame member 32 and the lid member 33. It should be noted that it is also possible to house an electrical component (an oscillator circuit) or the like to drive the vibrator element 2 inside the package 3 besides the vibrator element 2.

As the constituent material of the base substrate 31, a material having an insulation property (non-conductivity) is preferable, and various types of glass, various types of ceramic material such as oxide ceramics, nitride ceramics, or carbide ceramics, and various types of resin material such as polyimide can be used, for example.

Further, as the constituent material of the frame member 32 and the lid member 33, for example, a material similar to the constituent material of the base substrate 31, various kinds of metal material such as Al or Cu, and various types of glass material can be used. In particular, in the case of using the material having a light transmissive property such as a glass material as the constituent material of the lid member 33, the frequency adjustment of the vibrator element 2 can be performed by irradiating the mass section described above with a laser beam via the lid member 33 to remove the metallic coating to thereby reducing the mass of the vibrator element 2 (by a mass reduction method) even after housing the vibrator element 2 inside the package 3.

The vibrator element 2 described above is fixed to the upper surface of the base substrate 31 via a fixing member 36. The fixing member 36 is made of an adhesive such as an epoxy type, a polyimide type, or a silicone type. Such a fixing member 36 is formed by applying the adhesive, which is not yet cured (not yet solidified), to the surface of the base substrate 31, further mounting the vibrator element 2 on the adhesive, and then curing or solidifying the adhesive. Thus, the vibrator element 2 (the base section 27) is surely fixed to the base substrate 31.

It should be noted that the fixation can also be achieved using an electrically conductive adhesive such as an epoxy type, a polyimide type, or a silicone type including conductive particles.

Further, a pair of electrodes 35a, 35b is formed on the upper surface of the base substrate 31 so as to be exposed to the inner space S.

The electrode 35a is electrically connected to the connecting electrode 42 described above via, for example, a metal wire (a bonding wire) 38 formed using the wire bonding technology. Further, the electrode 35b is electrically connected to the connecting electrode 41 described above via, for example, a metal wire (a bonding wire) 37 formed using the wire bonding technology.

It should be noted that the connecting method between the pair of electrodes 35a, 35b and the connecting electrodes 41, 42 is not limited thereto, but can be performed using, for example, an electrically conductive adhesive. In this case, it is possible to reverse the vibrator element 2 from the drawing or to form the connecting electrodes 41, 42 on the lower surface of the vibrator element 2, for example.

Further, four external terminals 34a, 34b, 34c, and 34d are formed on the lower surface of the base substrate 31.

Among the four external terminals 34a through 34d, the external terminals 34a, 34b are hot terminals electrically connected to the electrodes 35a, 35b, respectively, via conductive posts (not shown) provided to the via holes formed in the base substrate 31. Further, the other two external terminals 34c, 34d are dummy terminals, which are used when mounting the package 3 on a mounting board, for increasing the bonding strength and homogenizing the distance between the package 3 and the mounting board.

Such electrodes 35a, 35b and external terminals 34a through 34d can be formed by, for example, providing gold plating to the surface of the foundation layer made of tungsten and nickel plating.

It should be noted that in the case of housing the electronic component inside the package 3, it is also possible to form a writing terminal for performing the characteristics inspection and rewriting (adjustment) of various information (e.g., temperature compensation information for the vibrator) in the electronic component on the lower surface of the base substrate 31 according to needs.

According to the first embodiment explained hereinabove, since the first mass section 51 and the second mass section 54 have the respective portions not overlapping each other viewed from the Z-axis direction (i.e., in the plan view), it is possible to remove separately (selectively) the first mass section 51 and the second mass section 54 in accordance with the irradiation position of the energy beam. Therefore, the elimination quantities of the first mass section 51 and the second mass section 54 due to the irradiation with the energy beam can be adjusted with high accuracy. Therefore, the adjustment of the frequency (the resonant frequency) can be performed with ease and high accuracy.

Further, the vibrator 1 provided with such a vibrator element 2 becomes superior in reliability.

Second Embodiment

A second embodiment of the invention will hereinafter be explained.

Figure 8A:
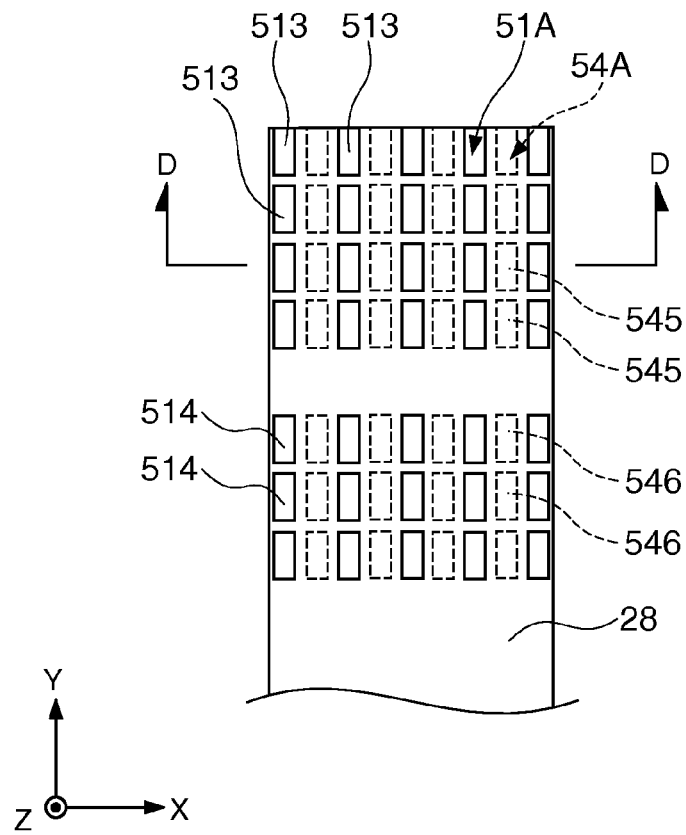
FIGS. 8A and 8B are partial enlarged views (FIG. 8A is a top view, and FIG. 8B is a cross-sectional view along the line D-D in FIG. 8A) for explaining a first mass section and a second mass section according to a second embodiment of the invention.
Figure 8B:
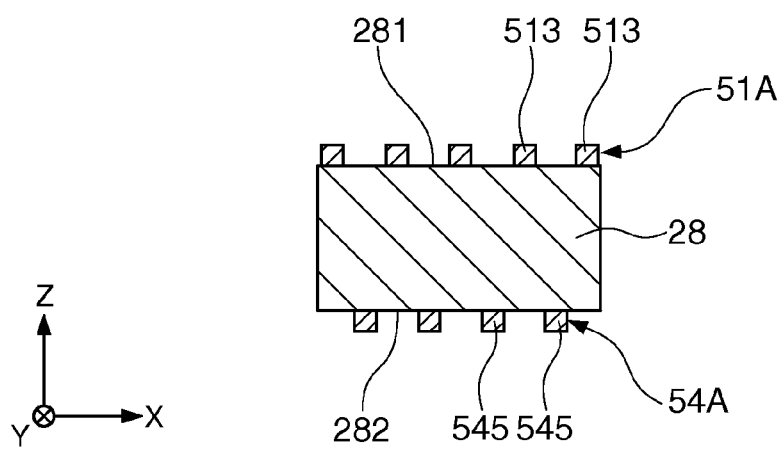

FIGS. 8A and 8B are partial enlarged views (FIG. 8A is a top view, and FIG. 8B is a cross-sectional view along the line D-D in FIG. 8A) for explaining the first mass section and the second mass section according to the second embodiment of the invention.

Hereinafter, the second embodiment will be described with a focus mainly on the differences from the first embodiment described above, and the explanations regarding the common matters will be omitted.

The second embodiment is substantially the same as the first embodiment except that the configuration of the first mass section and the second mass section is different. It should be noted that in FIGS. 8A and 8B, the constituents substantially identical to those of the embodiment described above are denoted by the same reference symbols. Further, in the present embodiment, although the first mass section and the second mass section disposed on the vibrating arm 28 will be explained as representatives, the same is applied to the first mass section and the second mass section disposed on each of the vibrating arms 29, 30.

As shown in FIGS. 8A and 8B, the first mass section 51A is disposed on the upper surface 281 of the vibrating arm 28, and the second mass section 54A is disposed on the lower surface 282 of the vibrating arm 28.

The first mass section 51A and the second mass section 54A are each for being partially or fully removed by, for example, irradiation with an energy beam to reduce the mass to thereby adjust the resonant frequency of the vibrating arm 28.

In a more specific explanation, the first mass section 51A is composed of a plurality of mass sections 513, and a plurality of mass sections 514 disposed nearer to the base portion of the vibrating arm 28 than the plurality of mass sections 513 in an arranged manner.

Here, the plurality of mass sections 513 constitutes a plurality of block sections arranged in the Y-axis direction and the X-axis direction forming a matrix. Similarly, the plurality of mass sections 514 constitutes a plurality of block sections arranged in the Y-axis direction and the X-axis direction forming a matrix.

In the present embodiment, the mass sections 513, 514 each have a strip shape (rectangle) having the Y-axis direction as the longitudinal direction. Further, the mass sections 513, 514 are arranged to have the same shape and the same size.

On the other hand, the second mass section 54A is composed of a plurality of mass sections 545 and a plurality of mass sections 546 disposed nearer to the base portion of the vibrating arm 28 than the plurality of mass sections 545.

Here, the plurality of mass sections 545 constitutes a plurality of block sections arranged in the Y-axis direction and the X-axis direction forming a matrix. Similarly, the plurality of mass sections 546 constitutes a plurality of block sections arranged in the Y-axis direction and the X-axis direction forming a matrix.

In the present embodiment, the mass sections 545, 546 each have a strip shape (rectangle) having the Y-axis direction as the longitudinal direction. Further, the mass sections 545, 546 are arranged to have the same shape and the same size.

In the first mass section 51A and the second mass section 54A described above, the column of the mass sections 513 arranged in the Y-axis direction and the column of the mass sections 545 arranged in the Y-axis direction are arranged alternately in the X-axis direction so as not to overlap each other when viewed in the Z-axis direction.

Similarly, the column of the mass sections 514 arranged in the Y-axis direction and the column of the mass sections 546 arranged in the Y-axis direction are arranged alternately in the X-axis direction so as not to overlap each other when viewed in the Z-axis direction.

Since the first mass section 51A and the second mass section 54A each have a plurality of block sections arranged in a matrix, it is possible to remove the first mass section 51A and the second mass section 54A by irradiation with the energy beam by each of the block sections (i.e., by each of the mass sections 513, 514, 545, and 546). Therefore, the elimination quantities of the first mass section 51A and the second mass section 54A can promptly (easily) be removed as much as the desired amount. Further, it becomes easy to predict the variation in the frequency of the vibrating arm 28 with respect to the elimination quantity of the first mass section 51A and the second mass section 54A. As a result, the frequency adjustment becomes easier and more accurate.

Further, according to the second embodiment described hereinabove, substantially the same advantage as in the first embodiment described above can be obtained.

Third Embodiment

A third embodiment of the invention will hereinafter be explained.

Figure 9A:
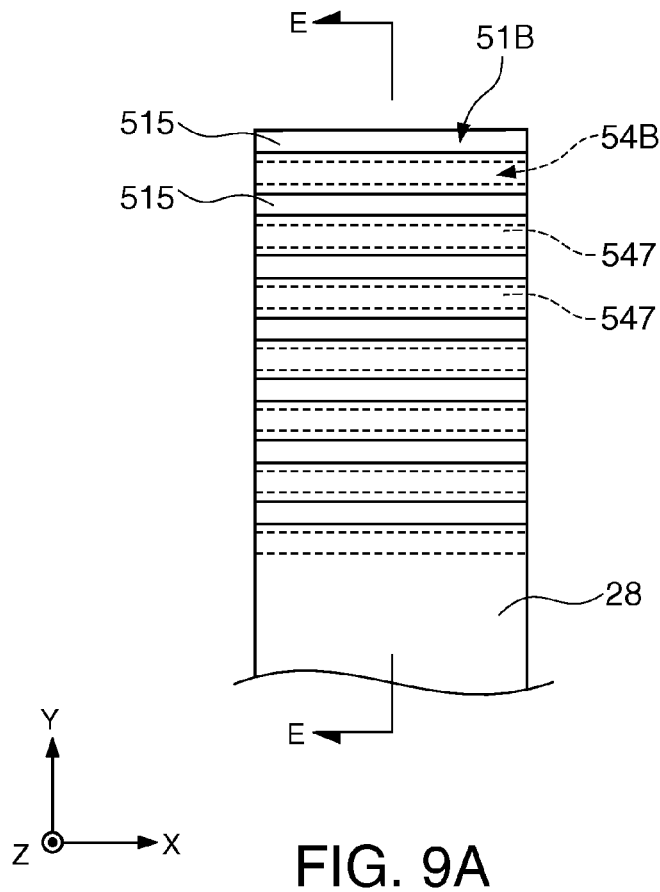
FIGS. 9A and 9B are partial enlarged views (FIG. 9A is a top view, and FIG. 9B is a cross-sectional view along the line E-E in FIG. 9A) for explaining a first mass section and a second mass section according to a third embodiment of the invention.
Figure 9B:
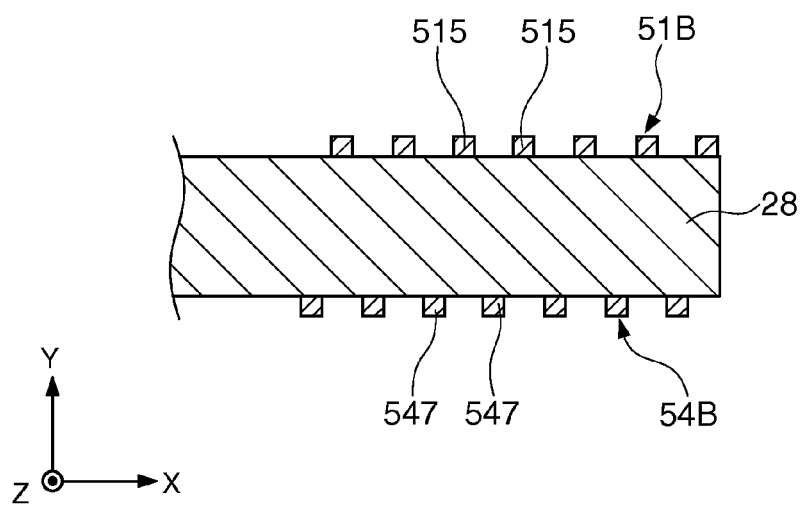

FIGS. 9A and 9B are partial enlarged views (FIG. 9A is a top view, and FIG. 9B is a cross-sectional view along the line E-E in FIG. 9A) for explaining the first mass section and the second mass section according to the third embodiment of the invention.

Hereinafter, the third embodiment will be described with a focus mainly on the differences from the embodiments described above, and the explanations regarding the common matters will be omitted.

The third embodiment is substantially the same as the first embodiment except that the configuration of the first mass section and the second mass section is different. It should be noted that in FIGS. 9A and 9B, the constituents substantially identical to those of the embodiments described above are denoted by the same reference symbols. Further, in the present embodiment, although the first mass section and the second mass section disposed on the vibrating arm 28 will be explained as representatives, the same is applied to the first mass section and the second mass section disposed on each of the vibrating arms 29, 30.

As shown in FIGS. 9A and 9B, the first mass section 51B is disposed on the upper surface 281 of the vibrating arm 28, and the second mass section 54B is disposed on the lower surface 282 of the vibrating arm 28.

The first mass section 51B and the second mass section 54B are each for being partially or fully removed by irradiation with an energy beam to reduce the mass to thereby adjust the resonant frequency of the vibrating arm 28.

In a more specific explanation, the first mass section 51B is composed of a plurality of mass sections (linear sections) 515.

Each of the mass sections 515 has a linear shape (strip shape) having the X-axis direction as the longitudinal direction. Here, the plurality of mass sections 515 forms a plurality of linear sections arranged in the Y-axis direction with intervals.

On the other hand, the second mass section 54B is composed of a plurality of mass sections 547.

Each of the mass sections 547 has a linear shape (strip shape) having the X-axis direction as the longitudinal direction. Here, the plurality of mass sections 547 forms a plurality of linear sections arranged in the Y-axis direction with intervals.

In the first mass section 51B and the second mass section 54B described above, the mass sections 515 and the mass sections 547 are arranged alternately in the Y-axis direction so as not to overlap each other when viewed in the Z-axis direction.

Since the first mass section 51B and the second mass section 54B each have a plurality of linear sections disposed with intervals, it is possible to remove the first mass section 51B and the second mass section 54B in a lump by scanning the energy beam irradiation section by each of the linear sections (i.e., by each of the mass sections 515, 547). Therefore, the first mass section 51B and the second mass section 54B can easily be removed as much as the desired amount. As a result, the frequency adjustment becomes easier and more accurate. Further, since the mass sections (the linear sections) are formed with the intervals, it is possible to prevent the cutting scraps generated when cutting the metal film by the laser from adhering to other metal films, thereby preventing the frequency shift due to the cutting scraps.

Further, according to the third embodiment described hereinabove, substantially the same advantage as in the first embodiment described above can be obtained.

Fourth Embodiment

A fourth embodiment of the invention will hereinafter be explained.

Figure 10A:
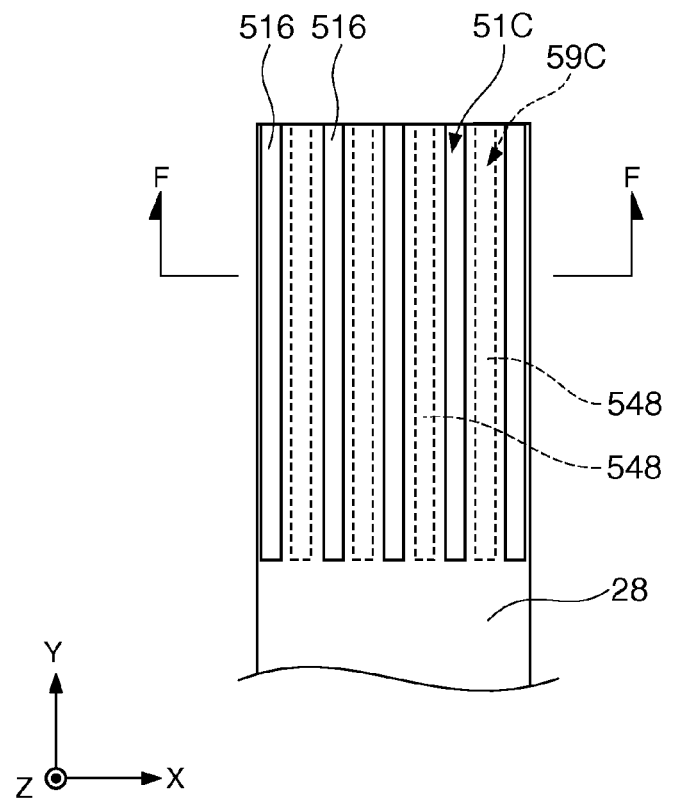
FIGS. 10A and 10B are partial enlarged views (FIG. 10A is a top view, and FIG. 10B is a cross-sectional view along the line F-F in FIG. 10A) for explaining a first mass section and a second mass section according to a fourth embodiment of the invention.
Figure 10B:
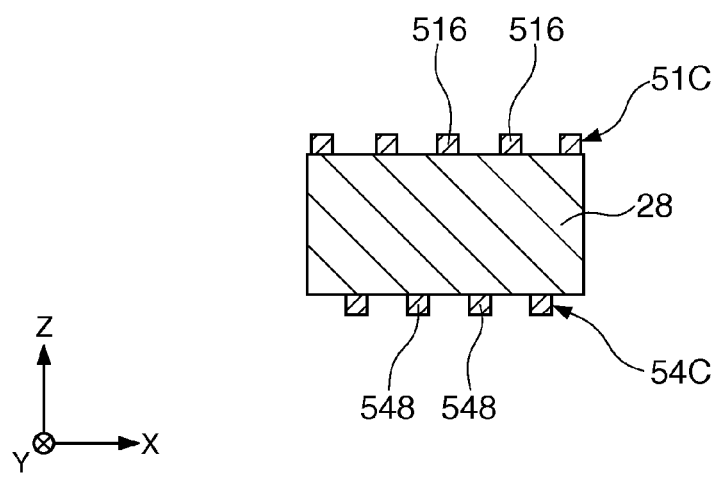

FIGS. 10A and 10B are partial enlarged views (FIG. 10A is a top view, and FIG. 10B is a cross-sectional view along the line F-F in FIG. 10A) for explaining the first mass section and the second mass section according to the fourth embodiment of the invention.

Hereinafter, the fourth embodiment will be described with a focus mainly on the differences from the embodiments described above, and the explanations regarding the common matters will be omitted.

The fourth embodiment is substantially the same as the first embodiment except that the configuration of the first mass section and the second mass section is different. It should be noted that in FIGS. 10A and 10B, the constituents substantially identical to those of the embodiments described above are denoted by the same reference symbols. Further, in the present embodiment, although the first mass section and the second mass section disposed on the vibrating arm 28 will be explained as representatives, the same is applied to the first mass section and the second mass section disposed on each of the vibrating arms 29, 30.

As shown in FIGS. 10A and 10B, the first mass section 51C is disposed on the upper surface 281 of the vibrating arm 28, and the second mass section 54C is disposed on the lower surface 282 of the vibrating arm 28.

The first mass section 51C and the second mass section 54C are each for being partially or fully removed by irradiation with an energy beam to reduce the mass to thereby adjust the resonant frequency of the vibrating arm 28.

In a more specific explanation, the first mass section 51C is composed of a plurality of mass sections (linear sections) 516.

Each of the mass sections 516 has a linear shape (strip shape) having the Y-axis direction as the longitudinal direction. Here, the plurality of mass sections 516 forms a plurality of linear sections arranged in the X-axis direction with intervals.

On the other hand, the second mass section 54C is composed of a plurality of mass sections 548.

Each of the mass sections 548 has a linear shape (strip shape) having the Y-axis direction as the longitudinal direction. Here, the plurality of mass sections 548 forms a plurality of linear sections arranged in the X-axis direction with intervals.

In the first mass section 51C and the second mass section 54C described above, the mass sections 516 and the mass sections 548 are arranged alternately in the X-axis direction so as not to overlap each other when viewed in the Z-axis direction.

Since the first mass section 51C and the second mass section 54C each have a plurality of linear sections disposed with intervals, it is possible to remove the first mass section 51C and the second mass section 54C by irradiation with the energy beam by each of the linear sections (i.e., by each of the mass sections 516, 548). Therefore, the elimination quantities of the first mass section 51C and the second mass section 54C can easily be removed as much as the desired amount. As a result, the frequency adjustment becomes easier and more accurate. Further, since the mass sections (the linear sections) are formed with the intervals, it is possible to prevent the cutting scraps generated when cutting the metal film by the laser from adhering to other metal films, thereby preventing the frequency shift due to the cutting scraps.

Further, according to the fourth embodiment described hereinabove, substantially the same advantage as in the first embodiment described above can be obtained.

Fifth Embodiment

A fifth embodiment of the invention will hereinafter be explained.

Figure 11A:
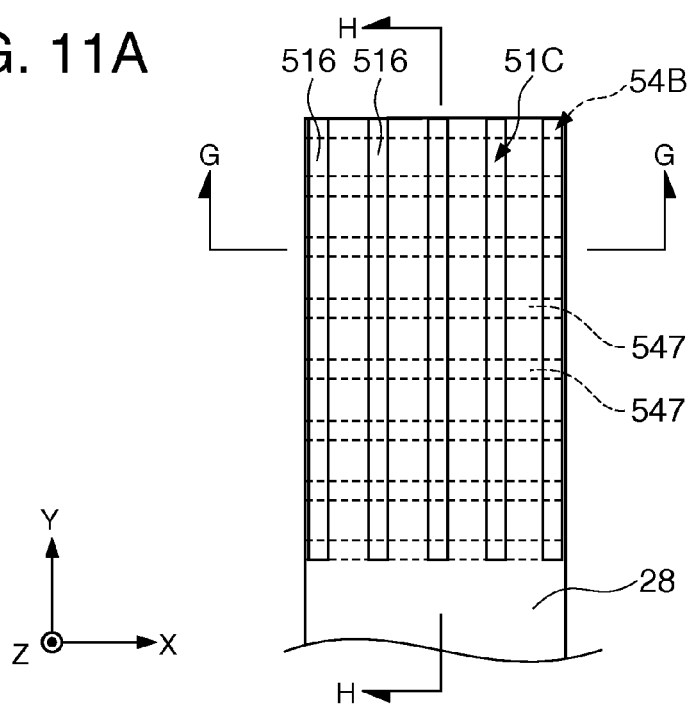
FIGS. 11A through 11C are partial enlarged views (FIG. 11A is a top view, FIG. 11B is a cross-sectional view along the line G-G in FIG. 11A, and FIG. 11C is a cross-sectional view along the line H-H in FIG. 11A) for explaining a first mass section and a second mass section according to a fifth embodiment of the invention.
Figure 11B:
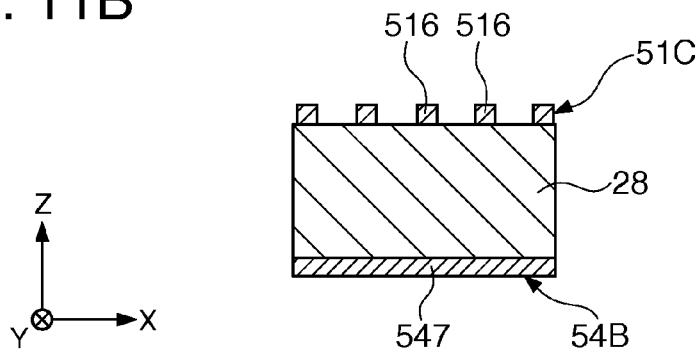
Figure 11C:
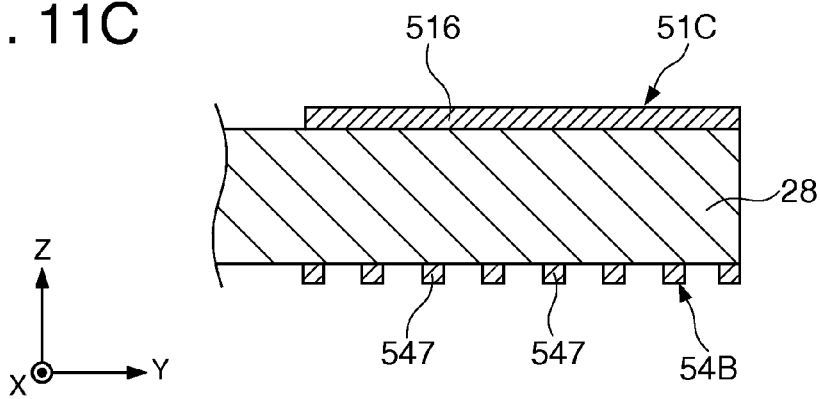

FIGS. 11A through 11C are partial enlarged views (FIG. 11A is a top view, FIG. 11B is a cross-sectional view along the line G-G in FIG. 11A, and FIG. 11C is a cross-sectional view along the line H-H in FIG. 11A) for explaining a first mass section and a second mass section according to the fifth embodiment of the invention.

Hereinafter, the fifth embodiment will be described with a focus mainly on the differences from the embodiments described above, and the explanations regarding the common matters will be omitted.

The fifth embodiment is substantially the same as the first embodiment except that the configuration of the first mass section and the second mass section is different. Further, the fifth embodiment is substantially the same as the third embodiment except that the configuration of the first mass section is different. Further, the fifth embodiment is substantially the same as the fourth embodiment except that the configuration of the second mass section is different. It should be noted that in FIGS. 11A through 11C, the constituents substantially identical to those of the embodiment described above are denoted by the same reference symbols. Further, in the present embodiment, although the first mass section and the second mass section disposed on the vibrating arm 28 will be explained as representatives, the same is applied to the first mass section and the second mass section disposed on each of the vibrating arms 29, 30.

As shown in FIGS. 11A through 11C, the first mass section 51C is disposed on the upper surface 281 of the vibrating arm 28, and the second mass section 54B is disposed on the lower surface 282 of the vibrating arm 28.

In the present embodiment, the plurality of mass sections 516 (the linear sections) of the first mass section 51C and the plurality of mass sections 547 (the linear sections) of the second mass section 54B are disposed so as to be perpendicular to each other.

Thus, when forming the first mass section 51C and the second mass section 54B on the vibrating arm 28, the first mass section 51C and the second mass section 54B each have portions, which do not overlap each other when viewed in the Z-axis direction, without requiring high accuracy in the positioning in the Y-axis direction and the X-axis direction.

Further, according to the fifth embodiment described hereinabove, substantially the same advantage as in the first embodiment described above can be obtained.

The vibrator element of each of the embodiments described hereinabove can be applied to various types of electronic apparatuses, and the electronic apparatuses thus obtained become highly reliable.

Here, the electronic apparatuses equipped with the vibrator element according to the invention will be explained in detail with reference to FIGS. 12 through 14.

Figure 12:
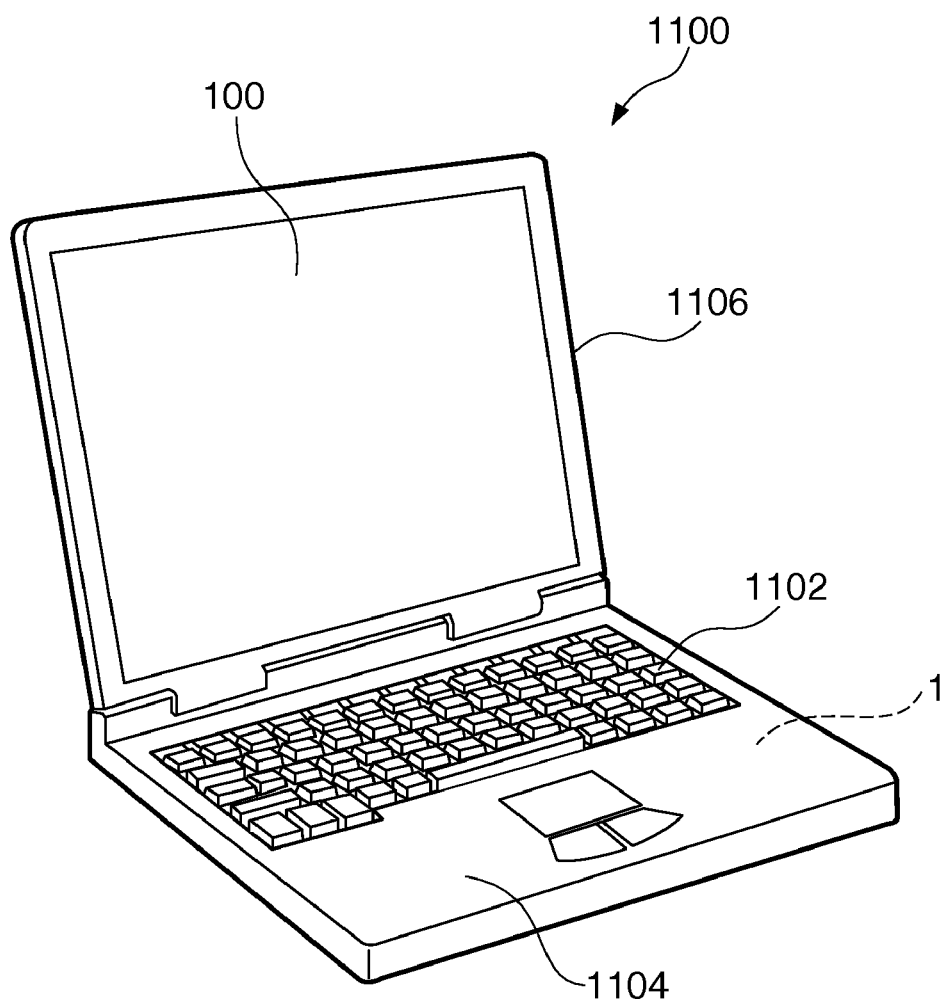
FIG. 12 is a diagram showing an electronic apparatus (a laptop personal computer) equipped with the vibrator element according to the invention.

FIG. 12 is a perspective view showing a configuration of a mobile type (or laptop type) of personal computer as an embodiment of the electronic apparatus equipped with the vibrator element according to the invention.

In the drawing, a personal computer 1100 is composed of a main body section 1104 equipped with a keyboard 1102, and a display unit 1106 equipped with a display section 100, and the display unit 1106 is pivotally supported with respect to the main body section 1104 via a hinge structure.

Such a personal computer 1100 incorporates the vibrator 1 functioning as a filter, a resonator, a reference clock, and so on.

Figure 13:
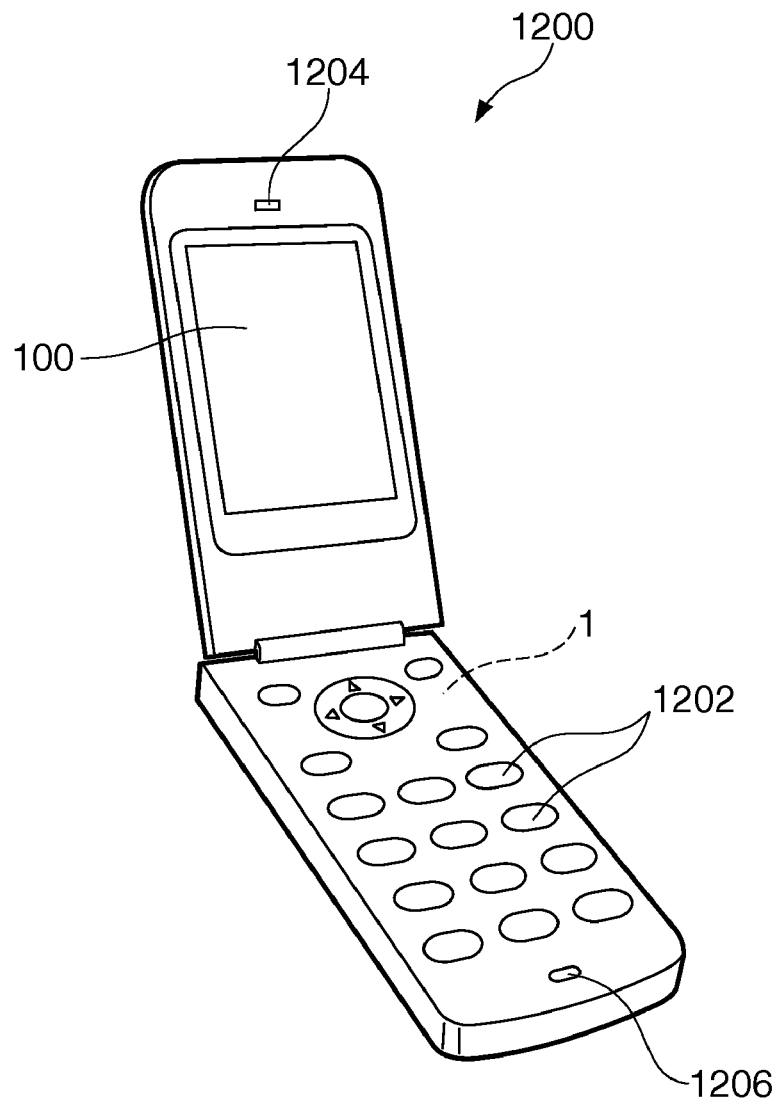
FIG. 13 is a diagram showing an electronic apparatus (a cellular phone) equipped with the vibrator element according to the invention.

FIG. 13 is a perspective view showing a configuration of a cellular phone (including PHS) as an embodiment of the electronic apparatus equipped with the vibrator element according to the invention.

In this drawing, the cellular phone 1200 is provided with a plurality of operation buttons 1202, an ear piece 1204, and a mouthpiece 1206, the a display section 100 is disposed between the operation buttons 1202 and the ear piece 1204.

Such a cellular phone 1200 incorporates the vibrator 1 functioning as a filter, a resonator, and so on.

Figure 14:
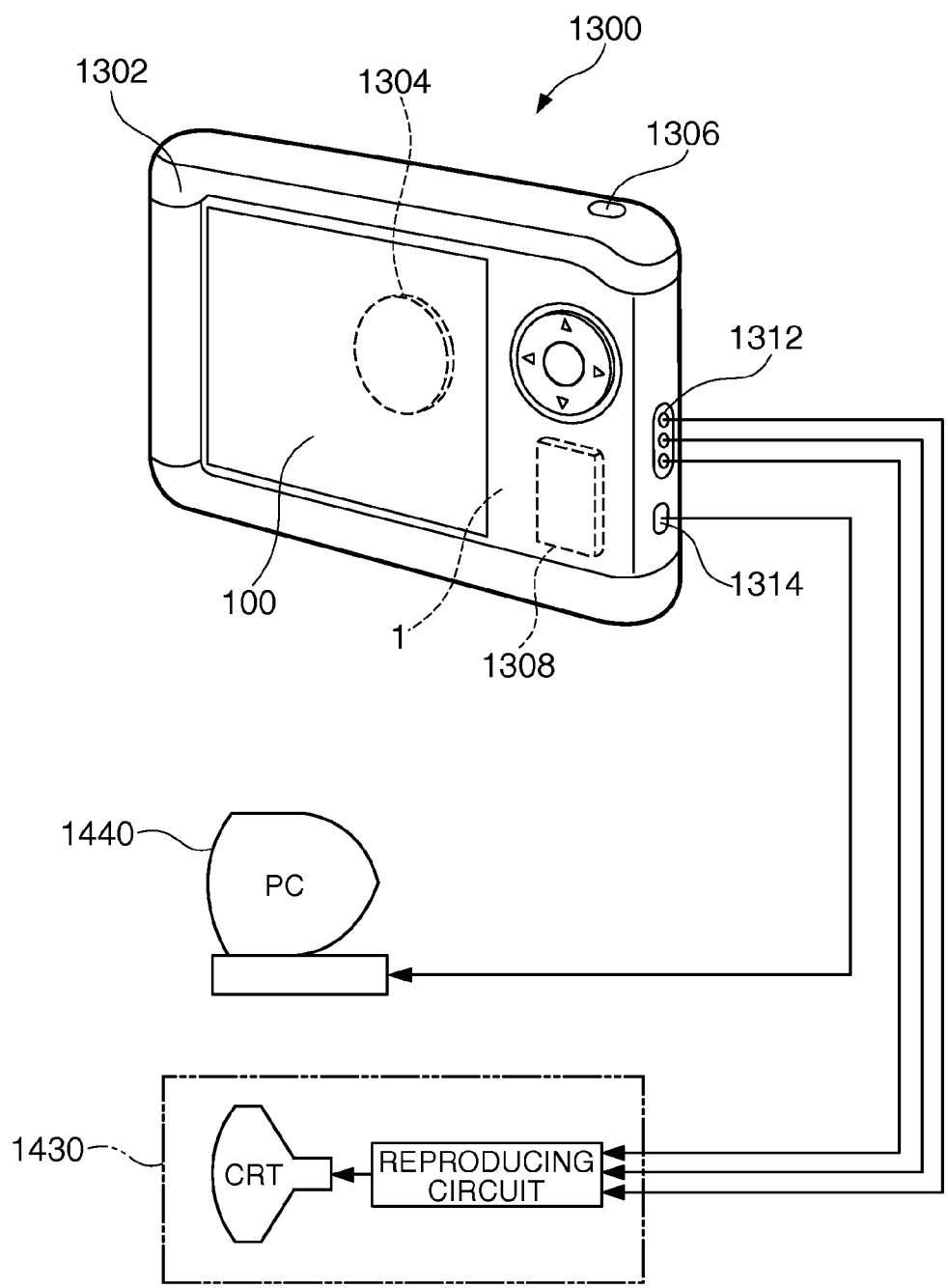
FIG. 14 is a diagram showing an electronic apparatus (a digital still camera) equipped with the vibrator element according to the invention.

FIG. 14 is a perspective view showing a configuration of a digital still camera as an embodiment of the electronic apparatus equipped with the vibrator element according to the invention. It should be noted that connection with external equipment is also shown schematically in this drawing.

Here, conventional cameras expose silver salt films to optical images of objects, while the digital still camera 1300 performs photoelectric conversion on optical images of objects by imaging elements such as CCD (charge coupled device) to generate imaging signals (image signals).

The case (body) 1302 of the digital still camera 1300 is provided with a display section on the back surface thereof to be configured to display images in accordance with the imaging signal from the CCD, wherein the display section functions as a viewfinder for displaying electronic images of the objects.

Further, the front surface (the back side in the drawing) of the case 1302 is provided with a light receiving unit 1304 including optical lenses (an optical imaging system) and the CCD.

When the photographer confirms an object image displayed on the display section, and then pushes a shutter button 1306 down, the imaging signal from the CCD at that moment is transferred to and stored in the memory device 1308.

Further, the digital still camera 1300 is provided with video signal output terminals 1312 and an input-output terminal 1314 for data communication disposed on a side surface of the case 1302. Further, as shown in the drawing, a television monitor 1430 and a personal computer 1440 are respectively connected to the video signal output terminals 1312 and the input-output terminal 1314 for data communication according to needs. Further, it is arranged that, in accordance with a predetermined operation, the imaging signals stored in the memory device 1308 are output to the television monitor 1430 or the personal computer 1440.

Such a digital still camera 1300 incorporates the vibrator 1 functioning as a filter, a resonator, and so on.

It should be noted that, as the electronic apparatus provided with the vibrator element according to the invention, there can be cited in addition to the personal computer (the mobile personal computer) shown in FIG. 12, the cellular phone shown in FIG. 13, and the digital still camera shown in FIG. 14, for example, an inkjet ejection device (e.g., an inkjet printer), a laptop personal computer, a television set, a video camera, a video cassette recorder, a car navigation system, a pager, a personal digital assistance (including one with communication function), an electronic dictionary, an electric calculator, a computerized game machine, a word processor, a workstation, a video phone, a security video monitor, a pair of electronic binoculars, a POS terminal, a medical device (e.g., an electronic thermometer, an electronic manometer, an electronic blood sugar meter, an electrocardiogram measurement instrument, an ultrasonograph, and an electronic endoscope), a fish detector, various types of measurement instruments, various types of gauges (e.g., gauges for a vehicle, an aircraft, or a ship), and a flight simulator.

Although the vibrator element, the vibrator, the vibration device, the electronic apparatus, and the frequency adjustment method according to the invention are hereinabove explained based on the embodiments shown in the accompanying drawings, the invention is not limited to these embodiments, but the configuration of each of the components can be replaced with one having an equivalent function and any configuration. Further, although in the embodiments described above the example of performing the frequency adjustment by irradiating the first mass section or the second mass section with the energy beam is explained, the invention is not limited thereto, but it is also possible to reduce the mass of the mass section by ion etching, sandblasting, or wet etching. Further, it is also possible to perform the frequency adjustment by increasing the mass of the mass section by depositing a film to the first mass section or the second mass section by sputtering or vapor-deposition. Further, it is possible to add any other constituents to the invention. Further, the apparatus according to the invention can be a combination of any two or more configurations (features) out of the embodiments described above.

For example, although in the embodiments described above the case in which the vibrator element has the three vibrating arms is explained as an example, the number of vibrating arms can also be one or two, or equal to or larger than four.

Further, the vibration device according to the invention can also be applied to a gyro sensor or the like besides the piezoelectric oscillators such as a quartz crystal oscillator (SPXO), a voltage controlled crystal oscillator (VCXO), a temperature compensated crystal oscillator (TCXO), and an oven controlled crystal oscillator (OCXO) by connecting the oscillator circuit to the vibrator element.

The entire disclosure of Japanese Patent Application No. 2010-130731, filed Jun. 8, 2010 is expressly incorporated by reference herein.

What is claimed is:
1. A vibrator element comprising:
a base section formed on a plane including a first direction and a second direction perpendicular to the first direction; and
a vibrating arm extending from the base section in the first direction,
wherein the vibrating arm flexurally vibrates in a normal direction of the plane, and has a first surface one of compressed and extended due to the flexural vibration and a second surface one of extended when the first surface is compressed and compressed when the first surface is extended, the first surface is provided with a first mass section, and the second surface is provided with a second mass section, and the first mass section and the second mass section are out of alignment in a plan view in the normal direction.

2. The vibrator element according to claim 1, wherein the first mass section and the second mass section have respective portions formed adjacent to each other in the second direction in a plan view in the normal direction.

3. The vibrator element according to claim 1, wherein at least one of the first mass section and the second mass section is formed to have a strip shape.

4. The vibrator element according to claim 1, wherein at least one of the first mass section and the second mass section has a plurality of block sections disposed with intervals.

5. The vibrator element according to claim 1, wherein the first mass section and the second mass section are each formed to have a strip shape, and have respective portions intersecting with each other in a plan view in the normal direction.

6. The vibrator element according to claim 1, wherein the second mass section is made of a material having specific gravity smaller than a constituent material of the first mass section.

7. The vibrator element according to claim 1, wherein at least one of the first mass section and the second mass section is constituted using at least one of $SiO_2$, Al, $Al_2O_3$, $TiO_2$, Cr, Fe, Ni, Cu, Ag, Au, and Pt.

8. The vibrator element according to claim 1, wherein a thickness of the first mass section is larger than a thickness of the second mass section.

9. The vibrator element according to claim 1, wherein the first mass section and the second mass section are disposed in a vicinity of a tip portion of the vibrating arm.

10. The vibrator element according to claim 1, wherein the vibrating arm is provided with a piezoelectric layer disposed between a first electrode layer and a second electrode layer.

11. The vibrator element according to claim 1, wherein two or more of the vibrating arms are disposed side by side in the second direction, and the two vibrating arms adjacent to each other flexurally vibrate in respective directions reverse to each other.

12. A frequency adjustment method comprising:

providing a vibrator element having a vibrating arm, which flexurally vibrates in a normal direction of a plane including a first direction and a second direction perpendicular to the first direction, and has a first surface one of compressed and extended due to the flexural vibration and a second surface one of extended when the first surface is compressed and compressed when the first surface is extended, the first surface being provided with a first mass section, the second surface being provided with a second mass section, and the first mass section and the second mass section are out of alignment in a plan view in the normal direction; and varying a mass of at least one of the first mass section and the second mass section, thereby adjusting a resonant frequency of the vibrating arm.

13. A vibrator comprising:
the vibrator element according to claim 1; and
a package adapted to house the vibrator element.

14. A vibration device comprising:
the vibrator element according to claim 1; and
an oscillator circuit connected to the vibrator element.

15. An electronic apparatus comprising:
the vibrator element according to claim 1.

* * * * *